United States Patent
Vaughn et al.

(10) Patent No.: US 11,153,136 B2
(45) Date of Patent: Oct. 19, 2021

(54) ELECTRICAL SYSTEMS AND METHODS FOR PERFORMING OUT-OF-BAND COMMUNICATIONS

(71) Applicant: Apple Inc, Cupertino, CA (US)

(72) Inventors: Robert Vaughn, Portland, OR (US); William Deleeuw, Beaverton, OR (US)

(73) Assignee: Apple Inc., Cupertino, CA (US)

( * ) Notice: Subject to any disclaimer, the term of this patent is extended or adjusted under 35 U.S.C. 154(b) by 357 days.

(21) Appl. No.: 15/771,426

(22) PCT Filed: Nov. 23, 2015

(86) PCT No.: PCT/US2015/062077
§ 371 (c)(1),
(2) Date: Apr. 27, 2018

(87) PCT Pub. No.: WO2017/091188
PCT Pub. Date: Jun. 1, 2017

(65) Prior Publication Data
US 2018/0343150 A1    Nov. 29, 2018

(51) Int. Cl.
| | |
|---|---|
| *H04L 27/00* | (2006.01) |
| *H04L 25/06* | (2006.01) |
| *H04L 1/22* | (2006.01) |
| *F24F 11/63* | (2018.01) |
| *H04B 11/00* | (2006.01) |

(Continued)

(52) U.S. Cl.
CPC .......... *H04L 27/0012* (2013.01); *F24F 11/63* (2018.01); *H04B 11/00* (2013.01); *H04L 1/22* (2013.01); *H04L 25/065* (2013.01); *H04L 25/4902* (2013.01); *H04L 27/0008* (2013.01)

(58) Field of Classification Search
USPC .......................................................... 367/137
See application file for complete search history.

(56) References Cited

U.S. PATENT DOCUMENTS 7,308,048 B2 * 12/2007 Wei ....................... H04L 7/0337
375/293
7,788,520 B2 * 8/2010 Langford ............ G06F 11/2038
714/3

(Continued)

FOREIGN PATENT DOCUMENTS

WO    2015012509 A1    1/2015

OTHER PUBLICATIONS

International Search Report based on application No. PCT/US2015/062077 (14 pages) dated Sep. 29, 2016 (Reference Purpose Only).

*Primary Examiner* — James R Hulka
(74) *Attorney, Agent, or Firm* — Kowert, Hood, Munyon, Rankin & Goetzel, P.C.

(57) ABSTRACT

An electrical system may include a processing circuit and one or more electrical components that emit thermal heat energy. The processing circuit may be configured to identify signal degradation or failure of an in-band communication channel between the electrical system and a second electrical system, identify a data message to transmit to the additional electrical system via an out-of-band communication channel, and direct the one or more electrical components to adjust an electrical workload to modulate and transmit the data message on the out-of-band communication channel as a recoverable sequence of thermal pulses.

21 Claims, 9 Drawing Sheets

(51) Int. Cl.
*H04L 25/49* (2006.01)
*G06F 11/00* (2006.01)
*G01R 19/00* (2006.01)

(56) References Cited

U.S. PATENT DOCUMENTS

| | | | |
|---|---|---|---|
| 8,666,313 B2 * | 3/2014 | Preston | H04W 8/005 |
| | | | 455/41.1 |
| 2004/0109406 A1 | 6/2004 | Rothman et al. | |
| 2005/0201491 A1 * | 9/2005 | Wei | H04L 27/02 |
| | | | 375/326 |
| 2006/0233291 A1 * | 10/2006 | Garlepp | H04L 7/0276 |
| | | | 375/355 |
| 2008/0111681 A1 | 5/2008 | Rathbone et al. | |
| 2009/0077412 A1 | 3/2009 | Langford et al. | |
| 2013/0029596 A1 | 1/2013 | Preston et al. | |
| 2015/0022013 A1 * | 1/2015 | Kim | H02J 7/025 |
| | | | 307/104 |

* cited by examiner

ELECTRICAL SYSTEMS AND METHODS FOR PERFORMING OUT-OF-BAND COMMUNICATIONS

CROSS-REFERENCE TO RELATED APPLICATIONS

This application is a national stage entry according to 35 U.S.C. 371 of WIPO Patent Application No. PCT/US2015/062077, filed Nov. 23, 2015, and is incorporated herein by reference in its entirety.

TECHNICAL FIELD

Various embodiments relate generally to electrical system and methods for performing out-of-band communications.

BACKGROUND

Failed communication links may cause crippling problems in a wide range of electrical systems, as even the failure of a single communication component may render an entire electrical system useless due to the lost ability to communicate internally between components or externally with other electrical systems. Such communication failure may thus be observed both internally within electrical systems, such as e.g. communication failure between two separate Central Processing Units (CPUs) in a single electrical system, or externally, such as between remote electrical system (e.g. a vehicular device) and a counterpart command electrical system.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
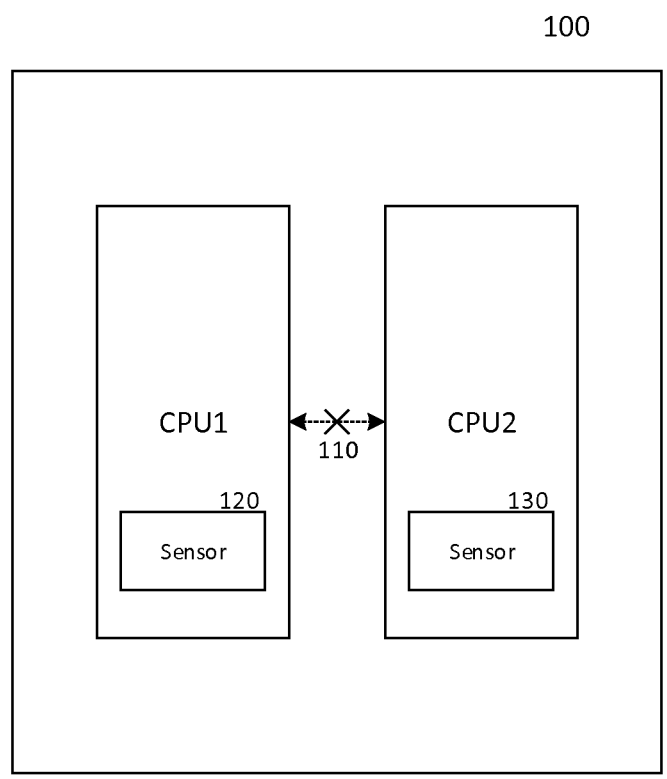
FIG. 1 shows an electrical system for performing thermal or EMI out-of-band communications.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The words "plural" and "multiple" in the description and the claims, if any, are used to expressly refer to a quantity greater than one. Accordingly, any phrases explicitly invoking the aforementioned words (e.g. "a plurality of [objects]", "multiple [objects]") referring to a quantity of objects is intended to expressly refer more than one of the said objects. The terms "group", "set", "collection", "series", "sequence", "grouping", "selection", etc., and the like in the description and in the claims, if any, are used to refer to a quantity equal to or greater than one, i.e. one or more. Accordingly, the phrases "a group of [objects]", "a set of [objects]", "a collection of [objects]", "a series of [objects]", "a sequence of [objects]", "a grouping of [objects]", "a selection of [objects]", "[object] group", "[object] set", "[object] collection", "[object] series", "[object] sequence", "[object] grouping", "[object] selection", etc., used herein in relation to a quantity of objects is intended to refer to a quantity of one or more of said objects. It is appreciated that unless directly referred to with an explicitly stated plural quantity (e.g. "two [objects]", "three of the [objects]", "ten or more [objects]", "at least four [objects]", etc.) or express use of the words "plural", "multiple", or similar phrases, references to quantities of objects are intended to refer to one or more of said objects.

As used herein, a "circuit" may be understood as any kind of logic implementing entity (analog or digital), which may be special purpose circuitry or a processor executing software stored in a memory, firmware, hardware, or any combination thereof. Furthermore, a "circuit" may be a hard-wired logic circuit or a programmable logic circuit such as a programmable processor, for example a microprocessor (for example a Complex Instruction Set Computer (CISC) processor or a Reduced Instruction Set Computer (RISC) processor). A "circuit" may also be a processor executing software, for example any kind of computer program, for example a computer program using a virtual machine code such as for example Java. Any other kind of implementation of the respective functions which will be described in more detail below may also be understood as a "circuit". It is understood that any two (or more) of the described circuits may be combined into a single circuit with substantially equivalent functionality, and conversely that any single described circuit may be distributed into two (or more) separate circuits with substantially equivalent functionality. Accordingly it is understood that references to a "circuit" may refer to two or more circuits that collectively form a single circuit.

A "processing circuit" (or equivalently "processing circuitry") as used herein is understood as referring to any circuit that performs an operation on a signal or signals, such as e.g. any circuit that performs processing on an electrical signal or an optical signal. A processing circuit may thus refer to any analog or digital circuitry that alters a characteristic or property of an electrical or optical signal, which may include analog and/or digital data. A processing circuit may thus refer to an analog circuit (explicitly referred to as "analog processing circuit(ry)"), digital circuit (explicitly referred to as "digital processing circuit(ry)"), logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Accordingly, a processing circuit may refer to a circuit that performs processing on an electrical or optical signal as hardware or as software, such as software executed on hardware (e.g. a processor or microprocessor). As utilized herein, "digital processing circuit(ry)" may refer to a circuit implemented using digital logic that performs processing on a signal, e.g. an electrical or optical signal, which may include logic circuit(s), processor(s), scalar processor(s), vector processor(s), microprocessor(s), controller(s), microcontroller(s), Central Processing Unit(s) (CPU), Graphics Processing Unit(s) (GPU), Digital Signal Processor(s) (DSP), Field Programmable Gate Array(s) (FPGA), integrated circuit(s), Application Specific Integrated Circuit(s) (ASIC), or any combination thereof. Furthermore, it is understood that a single a processing circuit may be equivalently split into two separate processing circuits, and conversely that two separate processing circuits may be combined into a single equivalent processing circuit.

As used herein, "memory" may be understood as an electrical component in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, it is appreciated that registers, shift registers, processor registers, data buffers, etc., are also embraced herein by the term memory. It is appreciated that a single component referred to as "memory" or "a memory" may be composed of more than one different type of memory, and thus may refer to a collective component comprising one or more types of memory. It is readily understood that any single memory component may be separated into multiple collectively equivalent memory components, and vice versa. Furthermore, it is appreciated that while memory may be depicted, such as in the drawings, as separate from one or more other components, it is understood that memory may be integrated within another component, such as on a common integrated chip.

Unless explicitly specified, the terms "transmit" and "send" encompass both direct and indirect transmission/sending. Similarly, the term "receive" encompasses both direct and indirect reception unless explicitly specified.

Communication link failure may occur internally within a single electrical system, such as intra-system communication failure between two or more internal system components of a singular system, or externally between separate electrical systems, such as inter-system communication failure between a first electrical and a second separate electrical system. Both intra- and inter-system communication failures may have significant negative impacts on performance, and in some cases may even render an entire electrical system(s) inoperable. In an example of inter-system communication failure, the failure of a communication subsystem in a space probe (such as a wireless transmitter-receiver antenna pair) may render the space probe incapable of communicating with a command system (e.g. orbital or terrestrial). As a result of such communication failure, the space probe may not be able to transmit any data back to the command system, which may in effect render the space probe useless. In an example of intra-system communication failure, the communication link between a first Central Processing Unit (CPU) and a second CPU (a data bus or similar wired electrical connection) in an embedded system may fail, thus terminating data exchange between the first CPU and the second CPU. Despite both CPUs remaining operable, the terminated communication link may significantly impair system performance due the inability of the CPUs to communicate with one another. Such may be problematic in both conventional CPUs in addition to modular compute systems or self-assembling compute systems.

Accordingly, such communication failures may be classified as "in-band" communication failures, where the dedicated communication link between two electrical systems fails. As detailed above, the occurrence of in-band communication failures may lead to entire system failure in certain cases due to the inability of essential components to communicate with one another. In recognition of this extreme scenario, electrical systems may be configured to utilize certain last-resort "out-of-band" (OOB) communication links to maintain communications with one another in the event of an in-band communication failure.

FIG. 1 shows electrical system 100 containing CPU1 and CPU2. As shown in FIG. 1, CPU1 and CPU2 may be connected via interface 110, which may be e.g. a data bus or other wired connection capable of transferring digital and/or analog data between CPU1 and CPU2. Electrical system 100 may any type of electronic device, ranging from dedicated computing systems (e.g. computers, mobile phones, tablets, game consoles, etc.) to other consumer devices and appliances (e.g. cameras, DVD players, televisions, printers, washing machines, refrigerators, Heating, Ventilation, and Air Conditioning (HVAC) systems) and vehicles (e.g. terrestrial, aerial, aquatic, space), or may be an embedded system, a integrated circuit (IC), system on a chip (SOC), etc., component of any such device. It is thus appreciated that electrical system 100 is not limited to any specific type or class of electronic device.

Interface 110 may be an in-band communication link between CPU1 and CPU2. CPU1 and CPU2 may thus exchange digital and/or analog data in a bi-directional manner with one another with interface 110. It is appreciated that interface 110 may be an electrical interface; however, interface 110 may alternatively be e.g. an optical interface such as a fiber optic interface. CPU1 and CPU2 may be mounted geographically proximate to one another within electrical system 100, such as on the same board, chip, or chassis.

The operation of electrical system 100 may be dependent on a continuous communication link between CPU1 and CPU2, e.g. over in-band interface 110, as termination of communication between CPU1 and CPU2 may isolate one or both of CPU1 and CPU2, thus significantly affecting the operation of electrical system 100.

Accordingly, in an exemplary scenario the communication link between CPU1 and CPU2 over interface 110 may fail. CPU1 and CPU2 may thus not be able to continue communicating due to the failure of the in-band communication link over interface 110. The severity of the resulting effect on electrical system 100 may vary depending on the criticality of CPU1 and CPU2; however, it is recognized that in certain cases electrical system 100 may be severely handicapped or even experience complete failure as a direct result of the malfunction of the in-band channel over interface 110.

Accordingly, CPU1 and CPU2 may employ an out-of-band (OOB) communication channel in order to continue communicating. As will be detailed, the efficacy of available OOB communication channels may in certain cases be severely limited compared to in-band communication channels, e.g. as compared to in-band communications over interface 110. However, in particular in scenarios where electrical system 100 faces complete failure in the absence of an operable communication link between CPU1 and CPU2, even limited communication mechanisms may be incredibly valuable in order to maintain system operation (e.g. at a reduced level) or even initiate troubleshooting procedures in order to potentially remedy the in-band communication failure.

As will be detailed, CPU1 and CPU2 may employ thermal, acoustic, Electromagnetic Interference (EMI), and/or power supply variation OOB communication mechanisms to communicate with one another in the event of an in-band communication failure.

Specifically, CPU1 and CPU2 may utilize a thermal OOB communication mechanism to maintain communications with one another, such as by modulating a binary data sequence as a sequence of thermal pulses, i.e. temperature increases, decreases, and plateaus. Many microprocessor components include integrated thermal sensors, which microprocessors may conventionally utilize to monitor microprocessor temperature to avoid overheating. Microprocessors may experience high internal temperatures or even overheating as a result of heavy computational workload, where increasingly heavy workloads may cause the internal temperature of a microprocessor to gradually increase. In contrast, the internal temperature of a microprocessor may fall to reduced levels during periods of relatively light workload or sleep.

As shown in FIG. 1, CPU1 and CPU2 may include sensor 120 and sensor 130, respectively, which may each be a thermal sensor configured to monitor the internal temperature of CPU1 and CPU2, respectively. CPU1 and CPU2 may employ thermal sensors 120 and 130 as part of a thermal OOB communication mechanism, in which one or both of CPU1 or CPU2 may utilize thermal sensor 120 or 130, respectively, to measure thermal variations of the other of CPU1 and CPU2. By controlling thermal pulses of one of CPU1 or CPU2, the other of CPU1 and CPU2 may be able to detect the resulting thermal variations with thermal sensor 120 or 130. CPU1 and CPU2 may thus control their internal temperature in order to modulate a binary data sequence as a series of thermal pulses detectable by the other of CPU1 and CPU2, thus offering an OOB communication mechanism between CPU1 and CPU2.

As previously indicated, microprocessors may heat up during periods of heavy computational workload, e.g. when a microprocessor is performing a large number of computational operations (executing instructions). In order to transmit an OOB message to CPU2 that is detectable by thermal sensor 130, CPU1 may artificially increase and decrease the workload of CPU1, such as by intermittently running empty or arbitrary instructions or other non-purpose instructions, in order to trigger temperature increase and decreases, i.e. thermal pulses. CPU2 may then be able to detect such thermal pulses caused by CPU1 with thermal sensor 130, which may detect the thermal pulses from CPU1 thermal deviations at thermal sensor 130. Given sufficient prior calibration, CPU2 may be configured to demodulate the detected thermal signature as a series of thermal pulses corresponding to a binary data sequence, and accordingly may recover the binary data sequence. Such a process may additionally be performed in the opposite direction as thermal pulses by CPU2 detected by CPU1 at thermal sensor 120 in order to provide a bidirectional communication link.

Figure 2:
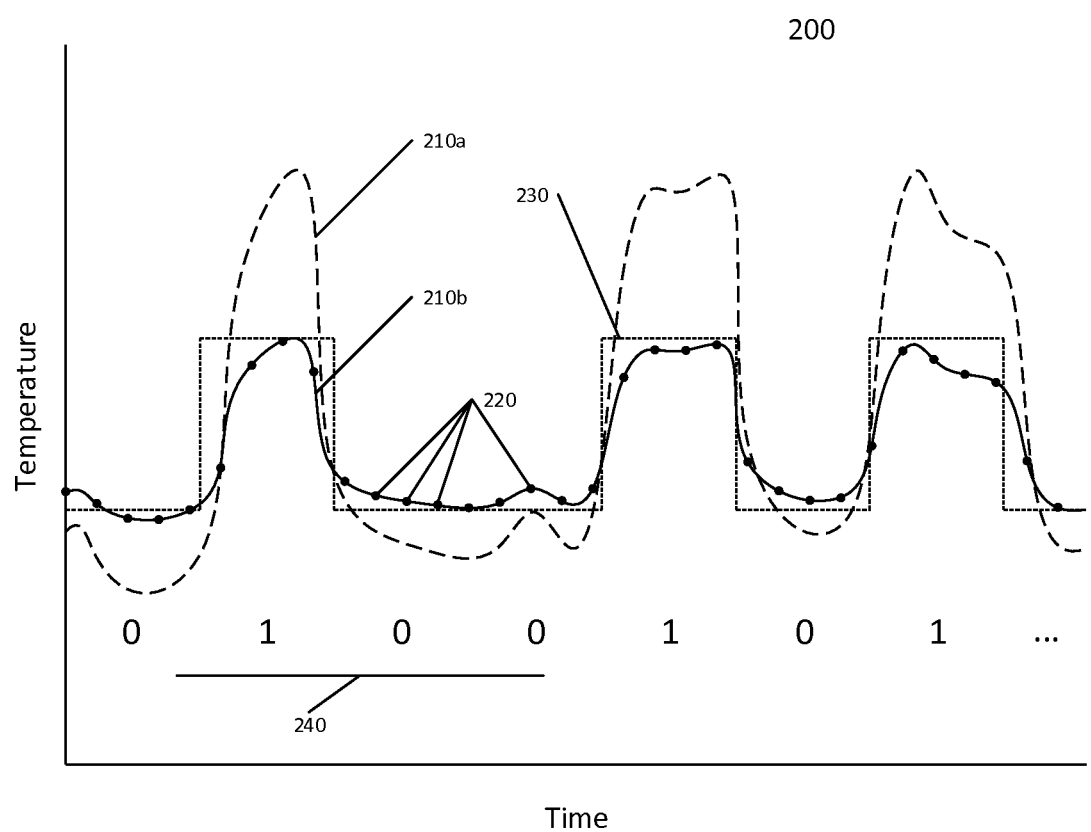
FIG. 2 a plot illustrating out-of-band communication signals.

FIG. 2 shows time-temperature plot 200, which contains emitted analog temperature curve 210a, detected analog temperature curve 210b, detected temperature samples 220, logical temperature curve 230, and detected binary sequence 240 plotted over a horizontal time-axis and vertical temperature-axis. Although FIG. 2 will be described with a substantial focus on temperature, it is appreciated that FIG. 2 may analogously relate to any one or more of the additional OOB communication mechanisms detailed herein, including Electromagnetic (EM) noise, sound/acoustics, or current/voltage fluctuations as will be later detailed.

CPU1 may detect during operation that the in-band communication link over interface 110 has failed, i.e. is offline. CPU1 may detect such failure through performing system status checks or by observing CPU2 is not responding to communications transmitted to CPU2 over interface 110. CPU1 may additionally recognize that all or most of the remaining functionality of CPU1 is intact, and thus that CPU1 remains capable of performing a range of computational operations.

In order to transmit data to CPU2 as a thermal signature, CPU1 may first suspend all non-essential tasks, such as e.g. any ongoing threads and processes. CPU1 may then identify a message to transmit to CPU2, which may be e.g. a beacon, error message, or SOS signal intended to notify CPU2 of the detected communication failure potentially in addition to providing information regarding the failure available at CPU1.

CPU1 may then determine a binary data sequence, i.e. a sequence of 0s and 1s, that corresponds to the message. The message and corresponding binary data sequence may be predefined, and consequently CPU1 and CPU2 may be preconfigured with exact knowledge of the error message/SOS signal, such as where the error message/SOS signal is a predefined data sequence. Alternatively CPU1 may determine the message "dynamically" while using predefined constraints, such as a message containing a dump of the last section of available RAM, last section of available cache, last executed instructions, last accessed files/locations, obtained data such as scientific or computational measurements, etc.

Upon obtaining the binary data sequence that CPU1 wishes to transmit, CPU1 may modulate the binary data sequence as a series of thermal pulses, i.e. temperature increases and decreases. In order to create such thermal pulses, CPU1 may artificially increase and decrease the computational workload of CPU1 in order to trigger resulting temperature increases and decreases as emitted from CPU1. Such may require prior calibration at CPU1 in order to determine the specific effects of workload variation on thermal emissions, thus ensuring that the actual emitted thermal signature of CPU1 matches the intended thermal signature corresponding to the binary data sequence.

CPU1 may additionally suspend all non-essential tasks (e.g. any ongoing or scheduled threads and processes) before and during thermal pulse generation. In doing so, CPU1 may control the emitted temperature of CPU1 to reach a "baseline" level, and may allow CPU1 to better control the emitted thermal pulse sequence by reducing other thermal emissions that are unrelated to the thermal OOB communication mechanism. After reaching a baseline temperature level, CPU1 may begin to increase and decrease the computational workload of CPU1, e.g. by running a sequence of arbitrary computational operations, in order to vary the emitted thermal signature of CPU1 according to the thermal pulse sequence. Such may include e.g. executing a sequence of arbitrary operations for a predefined period of time in order to create a thermal increase consistent with a logical 1 and subsequently suspending execution of operations (or e.g. executing a reduced/sparsely distributed in time number of operations in order to maintain a constant temperature) for a predefined period of time in order to create a thermal decrease, where the predefined periods of time may be determined via prior calibration in which emitted thermal signature is monitored and compared to the corresponding executed operation sequence that caused the emitted thermal signature. CPU1 may also produce plateaus by running at a moderate workload for a period of time and/or by intermittently suspending operations for short durations of time. Additionally, CPU1 may be configured to utilize a power supply fan in order to further control the emitted thermal signature, such as by running the power supply fan in order to reduce the emitted thermal signature and deactivating the power supply fan to increase the emitted thermal signature. CPU1 may further utilize sensor 120 (assuming such is included at CPU1) in order to provide feedback to CPU1 in order to accurately control the emitted thermal signature, such as by controlling a temperature decrease (e.g. by reducing operations and/or triggering a power supply fan) in the event that the emitted temperature for a logical 1 exceeds a precalibrated temperature value for a logical 1, and vice versa for temperature increases and/or logical Os. Furthermore, CPU1 may be able to utilize a power supply fan in such a manner with a substantially static CPU workload, such as by directly controlling the power supply fan to activate and deactivate in order to trigger variations in the thermal signature emitted by CPU1. In such a scenario, CPU1 may not necessarily be required to artificially modulate the internal computation workload of CPU1, and may instead be able to control a power supply fan in order to modulate a data message as a sequence of thermal pulses triggered by increases and decreases in emitted thermal signature, where the increases and decreases are controlled by the activity level of the power supply fan.

Accordingly, CPU1 may emit a thermal pulse sequence caused by the periodic temperature increases and decreases. For example, CPU1 may identify 0, 1, 0, 0, 1, 0, 1 (as depicted in FIG. 2) as the binary data sequence to be transmitted to CPU2, and may accordingly remain at a baseline thermal level for a first period of time, increase to a higher thermal level for a second period of time, decrease to the baseline level for a third and fourth period of time, increase to a higher thermal level for a fifth period of time, etc. In doing so, CPU1 may cause temperature increases and decreases in accordance with a binary data sequence. The binary data sequence (e.g. 0, 1, 0, 0, 1, 0, 1) may be the binary representation of the actual data message or a modulated version of the data message that has been modulated in accordance with a specific modulation scheme.

CPU1 may produce emitted analog temperature curve 210a as shown in FIG. 2 while attempting to transmit the 0, 1, 0, 0, 1, 0, 1 binary data sequence. CPU2 may then detect emitted analog temperature curve 210a with thermal sensor 130 as detected analog temperature curve 210b, which may depend on the proximity of CPU1 to CPU2, the sensitivity of thermal sensor 130, any additional extraneous thermal signatures, etc. For example, CPU1 and CPU2 may be mounted on a common chassis or board within electrical system 100, thus yielding considerable proximity between CPU1 and CPU2. Accordingly, emitted thermal variations by CPU1 may be readily detected by CPU2 with thermal sensor 130. Furthermore, although detected analog temperature curve 210b is depicted as a scaled version of emitted analog temperature curve 210a, such is merely for purposes of simplicity, and it is recognized that system imperfection in addition to extraneous thermal deviations may affect the similarity between detected analog temperature curve 210b and emitted analog temperature curve 210a.

As can be seen in FIG. 2, CPU1 may emit a thermal pulse sequence composed of periodic temperature increases and decreases. In the exemplary scenario of FIG. 2, the thermal pulse sequence may correspond to a logical data sequence of 0, 1, 0, 0, 1, 0, 1, which may be e.g. a predefined beacon, error message, SOS signal, or other message (modulated or unmodulated) that CPU1 intends to transmit to CPU2 over the thermal OOB communication channel.

In order to potentially detect the thermal pulse sequence emitted by CPU1, CPU2 may monitor the instantaneous temperature detected by thermal sensor 130 (e.g. by transducing detected thermal signatures into electrical signals) over a period of time, for which CPU2 may employ the existing temperature monitoring architecture in CPU2 for detecting overheating conditions. CPU2 may thus collect detected temperature samples 220 that collectively realize a sampled version of detected analog temperature curve 210b, where each detected temperature sample corresponds to a time point and temperature value, which may both be discretized according to the sampling configuration. CPU2 may then convert the detected temperature samples 220 into detected binary sequence 240, e.g. 0, 1, 0, 0, 1, 0, 1 in the exemplary scenario of FIG. 2 where logical temperature curve 230 is additionally depicted to illustrate the target thermal pulse sequence intended by CPU1. Accordingly, CPU2 may obtain a binary data sequence by monitoring the instantaneous temperatures detected by thermal sensor 130 over time. It is appreciated that CPU2 may perform digital detection on detected analog temperature curve 210b to obtain detected binary sequence 240 according to any established digital detection technique. Furthermore, it is appreciated that emitted thermal temperature curve 210a and detected thermal temperature curve 210b shown in FIG. 2 have been appreciably simplified, and that CPU1 may instead utilize a modulation scheme such as an analog (e.g. amplitude modulation (AM), frequency modulation (FM), phase modulation (PM), etc.) or digital modulation technique (e.g. phase shift keying (PSK), amplitude shift keying (ASK), frequency shift keying (FSK), quadrature amplitude modulation (QAM), orthogonal frequency division multiplexing (OFDM), etc.) to modulate the data sequence as opposed to transmitting a sequence of pulses directly corresponding to the binary data sequence. Regardless, it is understood that both unmodulated and modulated data, including both binary and analog, both include transmitting a sequence of "pulses".

Depending on any prior configuration of CPU1 and CPU2 to utilize thermal OOB communication channels, CPU2 may be configured to monitor a continuous stream of detected binary sequences (e.g. overlapping in time) provided via thermal sensor 130 to potentially detect a message from CPU1. For example, CPU2 may evaluate each overlapping window of a binary data sequence to identify whether the binary data sequence contains an error message or SOS signal from CPU1, such as e.g. 0, 1, 0, 0, 1, 0, 1 in the exemplary scenario of FIG. 2, such as by comparing each window of obtained binary data to a predefined binary sequence assigned as an indicator of a message from CPU1 to detect whether the predefined binary sequence is present. Upon detecting a message (beacon, error message, SOS signal, etc.) in the detected binary data sequence obtained from thermal sensor 130, CPU2 may identify that CPU1 has transmitted a message with the thermal OOB communication channel, and may proceed to perform one or more responsive operations (as will be later detailed).

It is appreciated that a wide range of modulation configurations may be available to an operator, such as regarding modulation scheme, coding rate, error correction, error detection, authentication, etc., that may affect the specific manner in which CPU1 modulates a binary data sequence as a thermal pulse sequence in order to transmit the binary data sequence to CPU2 over a thermal OOB channel. For example, CPU1 may utilize a preconfigured coding rate and modulation scheme that is also known at CPU2 in order to generate the thermal pulse sequence such that CPU2 is able to detect the thermal pulse sequence in accordance with the encoded binary data sequence. Additionally, CPU2 may be configured to utilize a certain sampling rate, e.g. in the conversion of detected analog temperature curve 210b to detected temperature samples 220, in order to effectively detect a binary data sequence transmitted by CPU1 as a thermal pulse sequence Such variations in modulation configuration are thus appreciated herein.

Furthermore, CPU1 and CPU2 may utilize an analog data sequence as an error message or SOS signal as opposed to a binary data sequence. For example, CPU1 and CPU2 may be preconfigured with one or more predefined analog error waveforms, which may analogously be composed of a sequence of one or more "pulses". Upon detecting an in-band communication failure, CPU1 may control its emitted thermal signature through electrical system workload increases and decreases in order to realize an emitted thermal signature corresponding to one of the predefined analog error waveforms (composed of a sequence of pulses). CPU2 may receive and analyze detected analog temperature curves provided by thermal sensor 130 (e.g. via thermal to electric transduction) in order to determine whether CPU1 has transmitted an error message in the form of an analog error waveform, and may execute a corresponding reactionary measure in response to detecting an error message from CPU1.

CPU2 may additionally employ a "listening mode" in order to increase the effectiveness of the thermal pulse detection. For example, CPU2 may enter a "listening mode" upon identifying that the in-band communication link over interface 110 is offline, i.e. has failed. For example, CPU2 may perform periodic system checks that include monitoring the status of communication links, or may monitor the amount of time since the last communication with CPU1. Upon detecting a failure in communication with CPU1 by any such method, CPU2 may enter "listening mode" in order to potentially detect thermal OOB communications from CPU1 with thermal sensor 130. CPU2 may enter an idle operational state upon initiating listening mode, which may include reducing the electrical system workload of CPU2 to minimal or no computing operations. Such may allow CPU2 to cool to an ambient temperature, e.g. a baseline temperature, which may assist thermal sensor 130 in detecting temperature variations caused by CPU1. CPU2 may need to remain in an idle state for a sufficient amount of time to reduce the internal temperature of CPU2 to the baseline temperature, where the sufficient amount of time may be predefined or may depend on the internal temperature of CPU2 upon first entering listening mode (e.g. as detected by thermal sensor 130). CPU2 may then begin monitoring the instantaneous temperature detected by thermal sensor 130 in order to perform digital detection and attempt to identify a binary data sequence transmitted by CPU1 as a thermal pulse sequence.

While in listening mode, CPU2 may need to execute various computational operations involved in sampling, digital detection, and analysis of the temperatures detected by thermal sensor 130. Accordingly, such computational operations may contribute to the temperatures detected by thermal sensor 130, which may lead to inaccurate detection if left uncompensated. In order to ensure accurate detection, CPU2 may be configured to monitor the current computational workload of CPU2 and approximate the expected temperature of CPU2 based on the current workload. Accordingly, via prior calibration CPU2 may be able to accurately estimate the expected temperature of CPU2 and subsequently attribute temperature deviations from the expected temperature to thermal pulses emitted by CPU1. CPU2 may additionally be configured to account for thermal contributions from other components of electrical system 100, and thus compensate for such extraneous thermal contributions during thermal pulse detection of CPU1.

Accordingly, CPU1 may be able to send data to CPU2 as a sequence of thermal pulses, which may be analog or digital and modulated or unmodulated. It is recognized that such thermal OOB communication may be appreciably limited in speed and efficiency compared to dedicated in-band communication channels, e.g. over interface 110. However, in particular where CPU1 and/or CPU2 are completely isolated in the event of in-band communication failure, even slow mediums of communication may be invaluable in order to allow for continued operation of electrical system 100 even at a reduced capacity.

In addition to unidirectional communications from CPU1 to CPU2, CPU2 may similarly be configured to generate a thermal pulse sequence detectable by CPU1 with thermal sensor 120 in the same manner as detailed above regarding CPU1. Accordingly, CPU1 and CPU2 may engage in bidirectional communications with the thermal OOB channel, thus allowing for increased data exchange between CPU1 and CPU2. Duplexing schemes may also be considered, such as by designating listening and transmitting periods alternatively to CPU1 and CPU2 such that one of CPU1 or CPU2 transmits at a given time while the other of CPU1 and CPU2 listens, which may improve performance. Alternatively CPU1 and CPU2 may be configured in a full-duplexing scheme in which each CPU considers the current workload and thermal emissions (e.g. during transmission) in detecting thermal pulses emitted by the other CPU.

In the exemplary scenario of FIG. 2 detailed thus far, CPU1 and CPU2 may include thermal sensors 120 and 130 which are both integrated into CPU1 and CPU2 for the purpose of monitoring the internal temperatures of CPU1 and CPU2, e.g. for monitoring for overheating. Accordingly, thermal sensors 120 and 130 are included for a different purpose than thermal OOB communications. Alternatively, CPU1 and/or CPU2 may be provided with thermal sensors 120 and 130 as purpose-built thermal sensors, i.e. provided primarily to support thermal OOB communications. Such thermal sensors may be configured with higher sensitivity than conventional integrated microprocessor thermal sensors, and accordingly may provide more accurate thermal pulse detection. Alternatively, CPU1 and/or CPU2 may be provided with an Infrared (IR) sensor to detect thermal pulses.

Furthermore, in certain use cases CPU1 may be configured to control additional component subsystems of electrical system 100. In the event that CPU1 retains control over such component subsystems despite in-band communication failure, CPU1 may additionally utilize the component subsystems as a load to generate additional thermal energy. For example, CPU1 may be configured to control other processing or memory components of electrical system 100 that are capable of generating heat e.g. by increasing electrical system workload, such as by increasing and decreasing the number of instructions executed on processing components (e.g. processing circuits) and increasing and decreasing memory operations of a memory component in order to increase and decrease the emitted thermal energy of such components. CPU1 may thus additionally control such components to contribute to the thermal pulse sequence emitted by CPU1, which may assist CPU2 in detecting the thermal pulse sequence due to increased thermal generation capacity.

Alternatively to a thermal OOB communications, CPU1 and CPU2 may be configured to communicate using one or more of acoustic OOB communications, Electromagnetic Interference (EMI) OOB communications, and/or current/voltage fluctuation OOB communications. Such OOB communications will additionally be later detailed in an inter-system OOB communication context.

For example, alternative to the description of FIG. 1 detailed above focusing on a thermal OOB communication channel, sensors 120 and 130 may be Electromagnetic Interference (EMI) sensors configured to detect wireless EM noise and transduce such wireless EMI into electrical signals available to CPU1 and CPU2. CPU1 and CPU2 may then employ EMI sensors 120 and 130 to perform EMI OOB communications. EMI sensors 120 and 130 may be e.g. Radio Frequency (RF) sensors configured to detect EMI.

EMI is often viewed as an unwanted byproduct of electrical systems, where fluctuating currents in electronic devices may introduce resulting wireless EM noise that may be observable at other proximate electronic devices. However, CPU1 and CPU2 may employ EMI emitted from each of CPU1 and CPU2 as another type of OOB communications, i.e. EMI OOB communications.

For example, the in-band communication channel between CPU1 and CPU2 over interface 110 may fail. CPU1 and CPU2 may subsequently detect the in-band communication failure and employ an EMI OOB communication channel to exchange error messages and/or continue communicating using the EMI OOB channel.

As CPU1 and CPU2 operate electronically, both CPU1 and CPU2 may emit EMI, which may be respectively detectable at each of CPU1 and CPU2 depending on the relative proximity of CPU1 and CPU2. Accordingly, CPU2 may enter a listening mode analogous to as detailed above regarding the thermal OOB communication channel, where CPU2 reduces the electrical system workload of CPU2 to a baseline level in which very little EMI is emitted. CPU2 may be calibrated to estimate the EMI produced by CPU2 given the current workload in order to compensate for the presence of such EMI in an EMI signature detected by EMI sensor 130. Concurrently, CPU1 may begin attempting to transmit a message to CPU2 with the EMI OOB communication channel.

CPU1 may alter the EMI signature emitted from CPU1 in order to communicate with CPU2. For example, CPU1 may alter the EMI signature emitted by CPU1 in a controlled manner in order to modulate a binary data sequence as a sequence of EMI pulses. Analogous as to detailed regarding the thermal OOB communication channel, CPU1 may control the emitted EMI signature in order to generate a series of EMI increases, decreases, and plateaus in order to generate a sequence of EMI pulses, i.e. as a sequence of logical 1s and 0s realized as an EMI curve.

There may exist different mechanisms for CPU1 and CPU2 to generate EMI pulses sufficient to modulate a binary data sequence. For example, CPU1 may increase and decrease the electrical system workload of CPU1 by executing an increased number of computational operations to increase the EMI output. Alternatively, CPU1 may modulate a binary data sequence by periodically increasing and decreasing the clock frequency of CPU1. Such clock frequency fluctuations may generate varying EMI emissions from CPU1, thus providing a mechanism for CPU1 to modulate a data sequence as EMI pulses by varying the clock frequency of CPU1 in a controlled manner. It is appreciated that the EMI for such an OOB EMI communication channel may be emitted from electrical circuits of CPU1 that are not configured as antennas, and thus that the emitted EMI is in effect a byproduct of standard operation of CPU1. Similarly to as detailed above regarding thermal OOB communications, CPU1 may additionally control one or more further electrical components connected to CPU1 in order to increase and decrease the EMI emitted from such components, such as by executing instructions or adjusting the clock frequency of processing and/or memory components in order to adjust the emitted EMI.

CPU1 may thus produce an emitted analog EMI curve (analogous to emitted analog temperature curve 210a of FIG. 2), which corresponds to a sequence of EMI pulses that represent a modulated data sequence. CPU2 may detect the EMI pulse sequence at EMI sensor 130 as a detected analog EMI curve (analogous to detected analog temperature curve 210b of FIG. 2), and may subsequently perform digital detection on the detected analog EMI curve to produce detected EMI samples (analogous to detected temperature samples 220) and a detected binary sequence (analogous to detected binary sequence 240). CPU2 may monitor the detected binary sequence obtained from EMI sensor 130 in order to determine whether the detected binary sequence contains a binary data sequence corresponding to a message transmitted by CPU1 as an EMI pulse sequence over the EMI OOB communication channel. Accordingly, CPU1 and CPU2 may continue to communicate despite the failure of the in-band communication channel over interface 110. CPU1 and CPU2 may additionally realize a bidirectional EMI OOB communication channel by shifting transmission and listening roles, where CPU2 modulates a binary data sequence as a sequence of EMI pulses that are subsequently obtained and detected by CPU1 with EMI sensor 120.

An EMI OOB communication channel between CPU1 and CPU2 may require relatively complex receivers, i.e. EMI sensors 120 and 130, in order to effectively detect EMI fluctuations. However, EMI OOB communication may prove appreciably faster than other OOB mechanisms including thermal and acoustic (as will be later detailed). EMI OOB communication may also be better suited to greater distances due to the potentially greater propagation distance compared to thermal signatures and acoustic signals.

CPU2 may detect and recover data from EMI pulse sequences based on wide bands of electromagnetic energy. Specifically, CPU1 may not have high-resolution control over the emitted EMI by CPU1 (and any additional controlled electronic components) in the frequency domain, and may as a result only be able to adjust the overall level of EMI emitted across wide EM frequency bands (as opposed to controlling the electromagnetic energy emitted in specifically defined EM bands as in the case of conventional RF communications). Accordingly, CPU2 may detect EMI pulse sequences emitted from CPU1 by monitoring the overall level of EMI in order to identify increases and decreases in the overall level of detected EMI.

Figure 3:
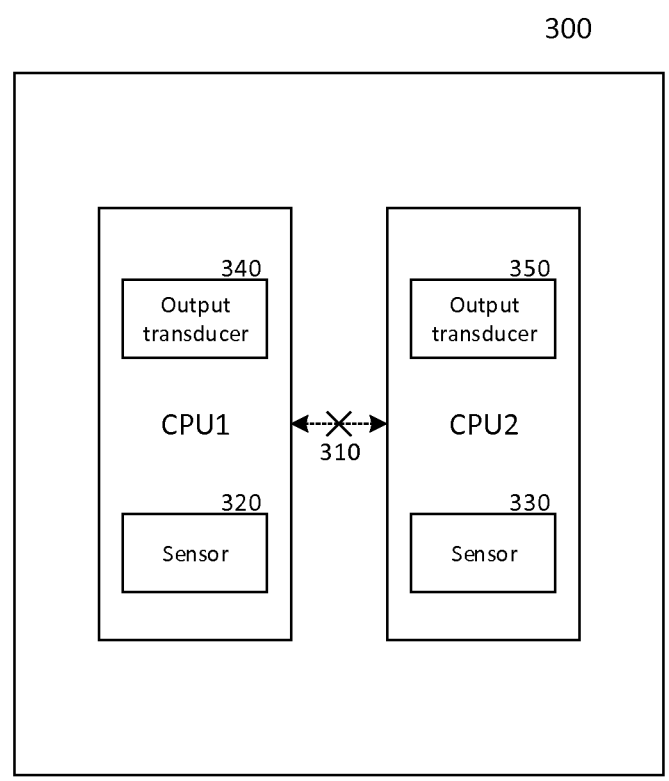
FIG. 3 shows an electrical system for performing acoustic out-of-band communications.

In addition to the thermal and EMI OOB communication channels, CPU1 and CPU2 may be configured to realize an acoustic OOB communication channel. FIG. 3 shows electrical system 300 including CPU1 and CPU2 configured in accordance with an acoustic OOB communication context.

It is appreciated that such acoustic OOB communications may not be limited to only the propagation of sound through air, and may be utilized in the context of vibrations through any medium.

In an acoustic OOB communication context, sensors 120 and 130 may be configured as acoustic sensors, e.g. acoustic sensors 120 and 130, respectively. Acoustic sensors 120 and 130 may be any type of audio, sound, or vibratory transducer, such as e.g. a microphone or similar acoustic-to-electric transducer or sensor. Acoustic sensors 120 and 130 may be configured to transduce audio signals proximate to CPU1 and CPU2 into electrical signals available to CPU1 and CPU2. CPU1 and CPU2 may monitor and sample such electrical signals provided by acoustic sensors 120 and 130 in order to obtain a digital data sequence, i.e. similarly to as detailed regarding digital detection in FIG. 2.

Accordingly, in a scenario where the in-band communication channel between CPU1 and CPU2 over interface 310 fails, CPU1 and CPU2 may utilize an acoustic OOB communication channel to exchange data. Specifically, CPU1 may determine that interface 310 is offline, and may thus decide to utilize acoustic OOB communications to transmit a message to CPU2. As shown in FIG. 3, CPU1 may include output transducer 340, which may a device capable of producing sound such as a fan, which may be included in (or proximate to) CPU1 for purposes of preventing overheating (e.g. a power supply fan or another cooling device). Output transducer 340 may alternatively be a transducer specifically configured to output acoustic signals, such as a speaker, or another electrical component that produces acoustical signals as a byproduct similar to a power supply fan. Further options for output transducer 340 include transformer components, which may produce an acoustic hum or vibration in response to alternating current flow. Similarly, relays may produce a series of "click" sounds spaced over time, and accordingly may be controlled as output transducer 340 by CPU1. Depending on the device configuration of electrical system 300, CPU1 may alternatively utilize a gyroscope (if present for mechanical stability) in order to similarly generate noise and/or vibration.

CPU1 may have available several different mechanisms to produce acoustic pulse sequences via output transducer 340. For example, CPU1 may have direct control over output transducer 340, and accordingly may be able to directly control the activity level of output transducer 340. Examples include controlling a power supply fan to activate and de-activate (or varying levels between), controlling the current supply through a transformer, controlling relays to switch, etc. In such cases, it may be straightforward for CPU1 to directly control the operation of output transducer 340 in order to modulate the acoustic signal emitted by output transducer 340 in accordance with the intended data message. Electrical system 300 may be purposefully configured to provide CPU1 with direct control over output transducer 340 to support OOB communications or such a configuration may be standard, i.e. not specifically for the purpose of OOB communications.

Alternatively, CPU1 may not have direct control over output transducer 340, and accordingly may not be able to directly control the acoustic signal emitted by output transducer 340. A particular example includes where output transducer 340 is a cooling device such as a power supply fan connected to CPU1 for the purpose of monitoring the internal temperature of CPU1 to prevent overheating. Accordingly, output transducer 340 may be configured to activate as a cooling device when the internal temperature of CPU1 rises above a certain level and de-activate if the internal temperature of CPU1 falls below a certain level. In such an example, electrical system 300 may additionally include a thermal sensor similar to thermal sensor 120 to monitor the internal temperature of CPU1, and additionally may include a control circuit configured to activate and de-activate output transducer 340 as a cooling device based on the temperature of CPU1 measured by the thermal sensor.

Accordingly, CPU1 may instead indirectly trigger increases and decreases in activity of output transducer 340 by increasing and decreasing the internal system workload of CPU1 in order to vary the temperature of CPU1. Output transducer 340 implemented as a cooling device may thus activate and de-activate in response to the measured temperature of CPU1 in order to prevent overheating. Accordingly, by artificially increasing and decreasing the workload of CPU1 (e.g. by running dummy instructions as previously detailed), CPU1 may indirectly trigger increases and decreases in the operation of output transducer 340, which when implemented as a cooling device such as a fan may as a result cause variations in the emitted acoustic energy of output transducer 340. CPU1 may thus artificially increase the workload of CPU1 in order to trigger activation of output transducer 340 as a power supply fan and decrease the workload of CPU1 to trigger deactivation of output transducer 340. CPU1 may thus be able to modulate a data message as a sequence of acoustic pulses emitted by output transducer 340 by artificially increasing and decreasing the workload of CPU1, thus triggering activation and deactivation of output transducer 340 as a result of the overheating prevention operation of output transducer 340 as a cooling device.

Accordingly, CPU1 may be able to control output transducer 340 (directly control or indirect control via varying the temperature of CPU1 to trigger activation/deactivation of output transducer 340 as a cooling device for overheating prevention) to generate acoustic pulses in order to modulate a binary data sequence as a sequence of acoustic pulses. CPU1 may thus control output transducer 340 to produce more, less, none, or constant acoustic energy (e.g. sound through air or vibrations through another medium) in order to generate a sequence of acoustic pulses, such as by controlling a fan to operate at higher speeds (producing greater acoustic energy), lower speeds (producing less acoustic energy), constant speed (producing constant acoustic energy), or no speed (producing no acoustic energy), which may include increasing, decreasing, and holding constant the air flow produced by output transducer 340. CPU1 may thus cause output transducer 340 to emit an analog acoustic curve analogous to emitted temperature curve 210a as detailed regarding FIG. 2. CPU2 may perform digital detection on an analog acoustic curve (analogous to detected analog temperature curve 210b of FIG. 2) provided by acoustic sensor 330 as an electrical signal to generate detected acoustic samples (analogous to detected temperature samples 220) and a corresponding detected binary sequence (analogous to detected binary sequence 240 of FIG. 2). CPU2 may then analyze the detected binary sequence to determine whether the detected binary sequence contains a message transmitted by CPU1 as a sequence of acoustic pulses by output transducer 340. CPU1 and CPU2 may additionally employ a bidirectional acoustic OOB communication channel through CPU2 controlling output transducer 350 to modulate a binary data sequence as a sequence of acoustic pulses detectable by acoustic sensor 320 at CPU1. CPU1 and CPU2 may similarly be calibrated to compensate for extraneous acoustic contributions that may be detected by acoustic sensors 320 and 330, such as acoustic emissions by CPU1 and CPU2 not related to the acoustic OOB communication sequence or acoustic emissions by other components of electrical system 300.

Figure 4:
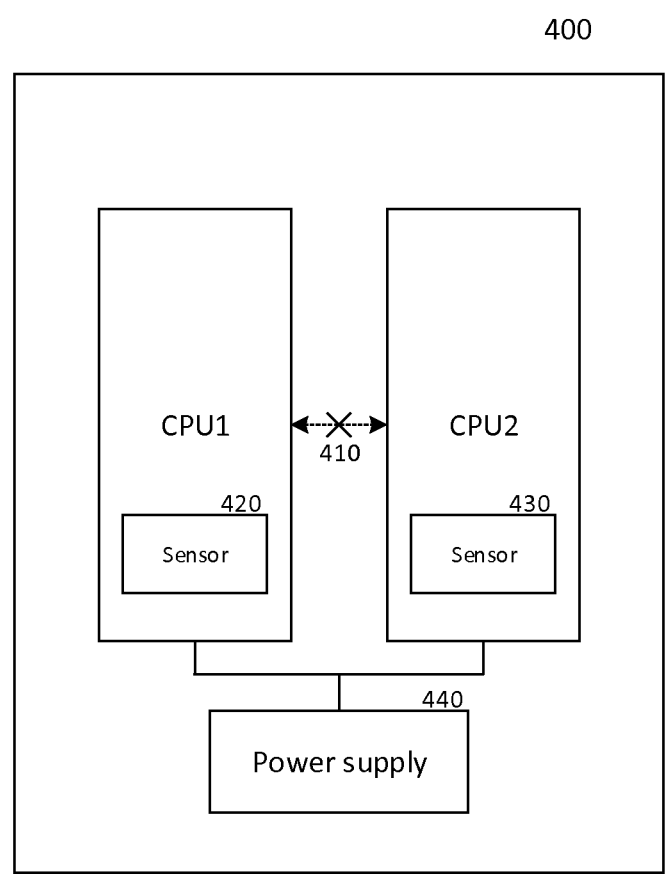
FIG. 4 shows an electrical system for performing power supply current/voltage out-of-band communications.

As will be detailed regarding FIG. 4, CPU1 and CPU2 may alternatively utilize a current/voltage fluctuation OOB communication channel. In a current/voltage fluctuation OOB communication mechanism, electrical system 400 may include CPU1 and CPU2, which may share a common power supply 440 (or be coupled to a shared power supply node or other shared node, e.g. either directly or indirectly).

Specifically, CPU1 and CPU2 may detect that the in-band communication channel over interface 410 is offline, and accordingly may resort to employing OOB communications to exchange error messages or continue communicating.

CPU1 and CPU2 may each include voltage/current sensors 420 and 430, respectively, which may be each be configured to monitor input voltage and/or current and provide resulting voltage/current measurements to CPU1 and CPU2.

Upon detecting the failure of interface 410, CPU2 may enter a listening mode while CPU1 enters an OOB transmitting mode. In order to transmit a message to CPU2, CPU1 may deliberately increase and decrease the amount of current drawn from common power supply 440. As CPU2 is additionally coupled to common power supply 440, CPU2 may be able to detect fluctuations in the current/voltage provided by common power supply 440 caused by the increasing and decreasing current draws by CPU1. Accordingly, voltage/current sensor 430 may measure the voltage/current provided by power supply 440 and provide such measurements to CPU2.

CPU1 may fluctuate the internal electrical system workload of CPU1 in order to cause such current draw increases and decreases. Accordingly, CPU1 may be configured to modulate a binary data sequence as a sequence of current draw pulses, which may subsequently be detected by CPU2 at current/voltage sensor 430 due to the common power supply coupling between CPU1 and CPU2 at common power supply 440. Accordingly, CPU1 and CPU2 may exchange data unidirectionally or bidirectionally by deliberately varying current draw at one or both of CPU1 and CPU2 in order to modulate a data sequence as a sequence of current/voltage pulses detectable by current/voltage sensors 420 and 430. It is appreciated that such a power supply current/voltage OOB communication mechanism may require CPU1 and CPU2 to have power supplies that are electrically coupled in some way. Regardless, a power supply current/voltage OOB communication mechanism may provide faster data exchange than thermal or acoustic OOB communications due to the use of an electrical medium. Additionally, CPU2 may include current/voltage sensor 430 as an internal component, which may be provided for purposes other than OOB communications. Accordingly, devices such as CPUs may be adapted to utilize power supply OOB communications with limited levels of special or dedicated modification.

The OOB communication mechanism detailed above regarding FIGS. 1, 3, and 4 are considered intra-system OOB communication mechanisms, where the OOB communication occurs between separate components (e.g. CPU1 and CPU2) within a single electrical system (e.g. electrical system 100, 300, or 400). As will be detailed, OOB communication mechanisms may also be realized to support inter-system OOB communication, i.e. OOB communications between separate entire electrical systems.

Real-world contexts of particular interest may include remote devices or vehicles such as space, deep-sea, and emergency situation (e.g. natural disaster, fire, nuclear disaster) probes and vehicles. Due to the isolated operation of such remote electrical systems relative to a central command system, it may be imperative to maintain some level of communicational functionality. For example, a deep-sea or emergency vehicle that experiences communication failure with a central command system may need to either return from a remote location to undergo repair or potentially may even be lost due to the inability to communicate with the central command system. In a more extreme example, a non-retrievable space probe that experiences communication failure may be rendered largely by the inability to provide any data back to a central command system. It is appreciated that such examples may include extreme use cases and that the following implementations may be analogously applied in inter-system OOB communication for any type of vehicle or device.

Figure 5:
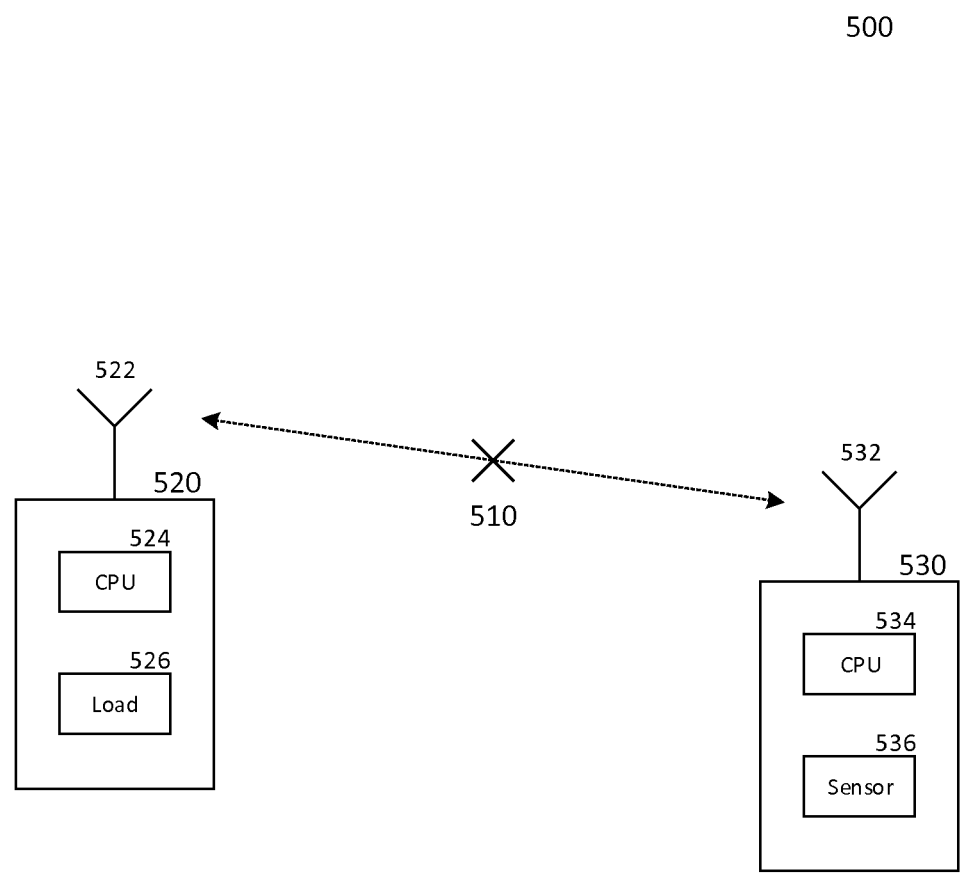
FIG. 5 shows an electrical system for performing out-of-band communications between a remote electronic device and a command electronic device.

FIG. 5 shows electrical system 500 composed of remote electronic device 520 and command electronic device 530, which may communicate with one another with an in-band communication channel over interface 510. As remote electronic device 520 may be spatially isolated from command electronic device 530, interface 510 may be a wireless interface. Accordingly, remote electronic device 520 may communicate with command electronic device 530 via wireless communications, e.g. a wireless transmitter-receiver pair, using e.g. wireless radio or optical (e.g. laser) signals received at antennas 522 and 532. Alternatively, depending on the application of electrical system 500 remote electronic device 520 may communicate with command electronic device 530 via wired communications, e.g. where interface 520 is an electrical or optical wire.

However, the in-band communication channel over interface 510 may fail, such as e.g. due to transmitter or receiver failure at either of remote electronic device 520 or command electronic device 530. Remote electronic device 520 may therefore be unable to communicate with command electronic device 530.

In order to avoid potential inoperability of remote electronic device 520, remote electronic device 520 and command electronic device 530 may resort to an OOB communication mechanism in order to exchange an error message or continue communicating, albeit at an appreciable reduced capacity.

Both remote electronic device 520 and command electronic device 530 may include respective CPUs 524 and 534, which may be configured to manage OOB communication mechanisms in addition to various additional functionalities of remote electronic device 520 and command electronic device 530. For example, CPUs 524 and/or 534 may additionally be configured to control in-band communications between remote electronic device 520 and command electronic device 530. CPUs 524 and/or 534 may additionally be configured to operate as a controller for remote electronic device 520 and command electronic device 530, respectively, and may accordingly be capable of controlling numerous other respective subsystem components of remote electronic device 520 and command electronic device 530 (not explicitly shown in FIG. 5).

Remote electronic device 520 and command electronic device 530 may utilize either thermal, EMI, or acoustic OOB communication mechanisms to exchange data, which may be limited to unidirectional in most use cases. In the event that remote electronic device 520 and command electronic device 530 share a common power supply (which may be unlikely due to the potential remote operation of remote electronic device 520 relative to command electronic device 530), remote electronic device 520 and command electronic device 530 may additionally utilize a power supply current/voltage OOB communication mechanism.

In a thermal OOB communication mechanism, CPUs 524 and 534 may detect that the in-band communication channel over interface 510 is offline, i.e. has failed. Accordingly, CPU 534 may enter a listening mode, which may include activating and controlling thermal sensor 536. In recognition of the potentially significant distance between remote electronic device 520 and command electronic device 530, thermal sensor 536 may be an Infrared (IR) sensor capable of detecting thermal radiation over large distances, e.g. between a space probe and a terrestrial or orbital communication array or between a deep-sea probe and a counterpart communication array. Accordingly, thermal sensor 536 may be most effective given a direct line of sight between thermal sensor 536 and remote electronic device 520. CPU 534 may additionally control one or more additional component subsystems of command electronic device 530 to enter an idle or low-power operational state if greater sensitivity is needed.

CPU 524 may concurrently enter a transmitting mode, which may include controlling one or more additional component subsystems of remote electronic device 520 to enter an idle or low-power operational state, in particular any non-essential component subsystems of remote electronic device 520 that generate considerable heat signatures.

Alternatively to deactivating such additional heat-generating component subsystems of remote electronic device 520, CPU 524 may exercise control over the heat-generating component subsystems in order to increase the thermal generation capacity of remote electronic device 520. As remote electronic device 520 may be located at a considerable distance from command electronic system 530, it may likely be infeasible for CPU 524 alone to generate thermal pulses detectable by CPU 534 at thermal sensor 536. Accordingly, CPU 524 may control the heat-generating component subsystems as heat-generating load 526. Heat-generating load 526 may be composed of a large range of different component subsystems that may appreciably depend on the structure and functionality of remote electronic device 520. For example, in a space probe context heat-generating load 526 may be composed of most or all computational components of space probe 520 in addition to thrusters and other navigational components, solar panels, external and internal scientific measurement hardware, antennas (if still functional), etc. CPU 524 may thus employ any heat-generating component of remote electronic device 520 that CPU 524 is able to reliably control, while potentially excluding select components that are incapable of dependable heat generation. CPU 524 may artificially increase and decrease the electrical system workload of the component subsystems of heat-generating load 526 in order to generate corresponding increases and decreases in thermal emissions.

Accordingly, CPU 524 may control heat-generating load 526 in order to cause a sequence of thermal emission increases and decreases. In doing so, CPU 524 may modulate a binary data sequence intended for command electronic device 530 as a sequence of thermal pulses (analogous to emitted analog temperature curve 210a of FIG. 2) emitted by heat-generating load 526. Given sufficient sensitivity and calibration of thermal sensor 536, CPU 534 may utilize thermal sensor 536 as an infrared sensor to detect the emitted thermal pulse sequence (analogous to detected analog temperature curve 210b) as thermal radiation and perform digital detection to obtain detected temperature samples (analogous to detected temperature samples 220) and a detected binary sequence (analogous to detected binary sequence 240). Accordingly, CPU 534 may demodulate the detected thermal pulse sequence of remote electronic device 520 to recover the corresponding binary data sequence. Accordingly, remote electronic device 520 and command electronic device 530 may exchange error messages and/or continue to exchange data at a reduced capacity using a thermal OOB communication mechanism. In certain contexts, the thermal OOB communication mechanism between a remote device and counterpart control device may be unidirectional, e.g. from the remote device to the counterpart control device, as it may be difficult or infeasible to include sensor capabilities such as an IR sensor at a remote device such as remote electronic device 520. Accordingly, remote electronic device 520 may be able to transmit data to command electronic device 530 but may not be able to receive any data from command electronic device 530. However such is not considered limiting; consequently remote electronic device 520 may include an analogous thermal sensor to receive data from command electronic device 530 in the form of modulated thermal pulses to realize a bidirectional thermal OOB communication channel. Furthermore, command electronic device 530 may include a heat-generating load (not shown in FIG. 5) capable of generating considerably stronger thermal pulses, which may in effect reduce the heat detection sensitivity required at remote electronic device 520.

Alternatively to thermal OOB communications, remote electronic device 520 and command electronic device 530 may utilize EMI OOB communications. Similarly to as detailed above regarding electrical system 100 in FIG. 1, electrical systems may generate electromagnetic noise as a byproduct of electrical operations, i.e. caused by current passing through electronic circuitry. Accordingly, remote electronic device 520 may be capable of generating EMI pulses detectable by command electronic device. Sensor 536 may therefore be an EMI sensor capable of detecting EMI over considerable distance, thus allowing command electronic device 530 to detect EMI pulses.

CPU 524 may similarly employ one or more additional component subsystems of remote electronic device 520 to increase the detectability of remote electronic device 520 by command electronic device 530 by EMI sensor 536. As opposed to utilizing the additional component subsystems of remote electronic device 520 as a heat-generating load, CPU 524 may instead utilize the additional component subsystems as EMI-generating load 526. Accordingly, CPU 524 may artificially increase and decrease the electrical system workload of the component subsystems of EMI-generating load 526 in order to generate increases and decreases in EMI emissions, which may include e.g. adjusting a clock frequency at CPU 524 and/or EMI-generating load 526.

CPU 524 may therefore be configured to control EMI-generating load 526 in order to modulate a binary data sequence intended for command electronic device 530 as a sequence of EMI pulses detectable at command electronic device 530 with EMI sensor 536. Accordingly, remote electronic device 520 may emit an analog EMI curve (analogous to emitted temperature curve 210a) which may be detected by command electronic device 530 with EMI sensor 536 as an analog detected EMI curve (analogous to detected temperature curve 210b). CPU 536 may then perform digital detection on the analog detected EMI curve obtained by EMI sensor 536 to generate detected EMI samples (analogous to detected temperature samples 220) and a detected binary sequence (analogous to detected binary sequence 240). CPU 536 may then analyze the detected binary sequence in order to potentially identify a message transmitted by remote electronic device 520 as a sequence of EMI pulses corresponding to a binary data sequence. Similarly to as detailed above regarding electrical system 500 in a thermal OOB communication context, remote electronic device 520 and command electronic device 530 may utilize the EMI OOB communication mechanism is a unidirectional manner, i.e. to transmit data from remote electronic device 520 to command electronic device 530, in recognition that it may be difficult or infeasible to include EMI sensing capabilities in a remote device such as remote electronic device 520. Alternatively, remote electronic device 520 may include an analogous EMI sensor capable of receiving data from command electronic device 530 in the form of modulated EMI pulses to realize a bidirectional EMI OOB communication channel. Furthermore, command electronic device 530 may include a EMI-generating load (not shown in FIG. 5) capable of generating considerably stronger EMI pulses, which may in effect reduce the EMI detection sensitivity required at remote electronic device 520.

Remote electronic device 520 and command electronic device 530 may alternatively utilize acoustic OOB communications. Similarly to as detailed above regarding electrical system 100 in FIG. 1, electrical systems may be outfitted with certain components that generate acoustic energy, such as cooling units including power supply fans. By increasing the system workload of such cooling units, e.g. by providing more power to such cooling units in order to increase exertion, an electrical system may control a cooling unit to emit more or less acoustic energy. Accordingly, remote electronic device 520 may be capable of generating acoustic pulses detectable by command electronic device, such as where sensor 536 is an acoustic sensor capable of detecting acoustic signals over considerable distances.

CPU 524 may similarly employ one or more additional component subsystems of remote electronic device 520 to increase the detectability of remote electronic device 520 by command electronic device 530 by acoustic sensor 536. As opposed to utilizing the additional component subsystems of remote electronic device 520 as a heat- or EMI-generating load, CPU 524 may instead utilize the additional component subsystems, such as cooling units and other components capable of generating acoustic energy, as acoustic-generating load 526. Accordingly, CPU 524 may artificially increase and decrease the electrical system workload of the component subsystems of acoustic-generating load 526 in order to generate increases and decreases in emitted acoustic energy, which may include e.g. adjusting the exerted power of a power supply fan of acoustic-generating load 526 in order to cause increases and decreases in emitted acoustic energy.

CPU 524 may therefore be configured to control acoustic-generating load 526 in order to modulate a binary data sequence intended for command electronic device 530 as a sequence of acoustic pulses detectable at command electronic device 530 with acoustic sensor 536. Accordingly, remote electronic device 520 may emit an analog acoustic curve (analogous to emitted temperature curve 210*a*) which may be detected by command electronic device 530 with acoustic sensor 536 as an analog detected acoustic curve (analogous to detected temperature curve 210*b*). CPU 536 may then perform digital detection on the analog detected acoustic curve obtained by acoustic sensor 536 to generate detected acoustic samples (analogous to detected temperature samples 220) and a detected binary sequence (analogous to detected binary sequence 240). CPU 536 may then analyze the detected binary sequence in order to potentially identify a message transmitted by remote electronic device 520 as a sequence of acoustic pulses corresponding to a binary data sequence. Similarly to as detailed above regarding electrical system 500 in a thermal and EMI OOB communication context, remote electronic device 520 and command electronic device 530 may utilize the acoustic OOB communication mechanism is a unidirectional manner, i.e. to transmit data from remote electronic device 520 to command electronic device 530, in recognition that it may be difficult or infeasible to include acoustic sensing capabilities in a remote device such as remote electronic device 520. Alternatively, remote electronic device 520 may include an analogous acoustic sensor capable of receiving data from command electronic device 530 in the form of modulated acoustic pulses to realize a bidirectional acoustic OOB communication channel. Furthermore, command electronic device 530 may include an acoustic-generating load (not shown in FIG. 5) capable of generating considerably stronger acoustic pulses, which may in effect reduce the acoustic detection sensitivity required at remote electronic device 520.

The range of acoustic OOB communications between remote electronic device 520 and command electronic device 530 may be appreciably limited compared to EMI OOB communications due to the inefficient propagation of acoustic energy. Furthermore, such acoustic OOB communications may not be feasible in the absence of an effective medium, such as in the case of a space probe or other astronomical vehicle. However, it is nevertheless recognized that acoustic OOB communications may be employed despite such limitations.

The power supply current/voltage OOB communication mechanism detailed above regarding electrical system 400 may also be expanded to an inter-system OOB communication context, such as between two separate electronic systems that are not contained in e.g. the same board or chassis yet still share a common power supply. Accordingly, any two electronic systems sharing a common power supply (directly or indirectly) may be able to utilize power supply current/voltage OOB communications by employing the use of current/voltage sensors and a CPU or other control circuit configured to analyze the output of such sensors.

There exist many potential adjustments and improvements to the thermal, EMI, acoustic, and current/voltage fluctuation OOB communication mechanisms detailed herein. One or more of the following variations may be applied to any of the OOB communication mechanisms detailed above.

For example, the participating CPUs (e.g. CPU1, CPU2, CPU 524, and/or CPU 534) may be configured to resort to an OOB communication mechanism if a CPU detects that the in-band communication link has deteriorated to a sufficiently poor level. Accordingly, the participating CPUs may not rely on complete failure of the in-band communication channel before switching to an OOB communication mechanism, and may instead be configured to initiate OOB communication mechanisms upon recognizing that the in-band communication channel has significantly deteriorated. Such deterioration may be detected by performing status checks such as channel quality evaluations to evaluate the in-band communication channel.

The OOB communication mechanisms may be configured to obey specific predefined OOB communication protocols. For example, the OOB communication mechanism may be unidirectional, and accordingly may function as a beacon or similar SOS-type communication system. Accordingly, the transmitting electrical system (e.g. CPU1 or remote electrical device 520 in the above unidirectional examples) may need to obey specific protocols in determining what data to send to the listening electrical system (e.g. CPU2 or remote electrical device 530 in the above unidirectional examples). It is appreciated that the terms "transmitting" and "listening" are not limiting and that both the transmitting and listening electrical systems may be configured to both transmit and listen over an OOB communication channel, such as over a bidirectional OOB communication channel.

For example, the transmitting electrical system may be configured to transmit either a predefined static message or a dynamic message. In the predefined static message case, the transmitting electrical system may transmit one or more predefined data messages upon detection of in-band communication failure. The transmitting electrical system may be configured to transmit a predefined SOS or error message. Additionally or alternatively, the transmitting electrical system may be configured to transmit a message containing a dump of the last section of available RAM, last section of available cache, last executed instructions, last accessed files/locations, obtained data such as scientific or computational measurements, etc. Such may be preconfigured in both the transmitting electrical system and the listening electrical system in order to allow for message identification and decoding, and may include providing a header message or other identifier that identifies the type of static message from a predefined pool of static messages.

In the dynamic message case, the transmitting electrical system may determine on its own (e.g. based on a predefined algorithm) the type and nature of data that should be transmitted on the OOB communication channel, such as based on various boundaries, situations, or events pertaining to the communication failure.

As previously indicated, an operator may have a wide range of modulation configurations available to utilize in an OOB communication mechanism, such as modulation scheme, coding rate, error correction, error detection, authentication, etc. Depending on the efficiency and accuracy of the selected OOB communication mechanism, certain modulation schemes and coding rates may be more suitable. For example, slower coding rates and simple modulation schemes may be necessary in thermal OOB communication mechanisms due to the relatively gradual nature of thermal variations, while faster coding rates may be realizable in EMI and current/voltage fluctuation OOB communication mechanisms. Furthermore, a digital or analog modulation technique may be utilized in order to modulate a data sequence, such as amplitude modulation (AM), frequency modulation (FM), phase modulation (PM), phase shift keying (PSK), amplitude shift keying (ASK), frequency shift keying (FSK), quadrature amplitude modulation (QAM), orthogonal frequency division multiplexing (OFDM), or any other established analog or digital modulation technique.

Additionally, an OOB communication mechanism may utilize error detection in order to evaluate whether received messages are excessively corrupted. For example, the transmitting electrical system may encode a message using an error-detecting code, such as e.g. repetition codes, parity bits, checksums, Cyclic Redundancy Check (CRC), etc., which the listening electrical system may then evaluate to determine if the message is corrupted.

Additionally, an OOB communication mechanism may utilize an error correction scheme, such as e.g. Forward Error Correction (FEC) in order to potentially correct transmission and reception errors, such as e.g. Viterbi Trellis Coding or a Turbo code. For example, the transmitting electrical system may encode a message using an error-correcting code. The listening electrical system may then apply error correction in order to decode the received message, which may allow the listening electrical system to correct transmission and reception errors in order to improve detection performance.

An OOB communication mechanism may additionally utilize authentication in order to prevent security comprises. For example, a malicious third party may theoretically be able to generate a pulse sequence detected by the listening electrical system that appears to have been transmitted by the transmitting electrical system. In order to prevent such security comprises, the transmitting and listening electrical systems may utilize an authentication verification process, such as a digital signature, hash, public-private key system, or any other established authentication process in order to both sign (by the transmitting electrical system) and verify (by the listening electrical system) the authenticity of OOB communications. For example, the transmitting and listening electrical systems may use an attestation technology such as Trusted Execution Technology (TXT) to protect OOB communications.

It is recognized that error correction, error detection, and authentication may increase overhead, which may negatively impact data throughput. As transmission rates may already be limited, in particular with thermal OOB communications at potentially only several bits per minute, the inclusion of error correction/detection and/or authentication may result in even slower transmission rates. However, given many scenarios where data transmission is invaluable (e.g. where the alternative is system failure), it may nevertheless be advantageous to utilize such mechanisms in order to increase integrity.

OOB data messages may additionally include a low autocorrelation timing-acquisition introductory porting such as e.g. a Barker code, which the transmitting electrical system may transmit before the payload portion (e.g. error message) of the OOB data message. The transmitting electrical system may additionally include a fine-timing-acquisition portion following the initial (coarse) timing-acquisition portion. An exemplary timing acquisition portion may be an "alternating mark", i.e. a "01010101 . . . " to ensure a maximum number of transitions.

Furthermore, a listening electrical system may be configured to react in a number of different manners in response to receiving an OOB communication from a transmitting electrical system after in-band communication failure. For example, if the OOB communication channel is bidirectional the listening electrical system and transmitting electrical system may continue data exchange over the bidirectional OOB communication channel, although likely at a drastically reduced data rate. Alternatively, the transmitting and listening electrical systems may select critical data, such as a dump of the last section of available RAM, last section of available cache, last executed instructions, last accessed files/locations, obtained data such as scientific or computational measurements, etc., to be transmitted from the transmitting electrical system to the listening electrical system over the OOB communication channel.

The transmitting and listening electrical systems may additional engage in troubleshooting or repair operations upon the listening electrical system receiving an error message or SOS signal from the transmitting electrical system on a bidirectional OOB communication channel. For example, the listening electrical system may transmit commands to the transmitting electrical system in order to attempt to troubleshoot the in-band communication failure, such as triggering reboot operations or other system functionality available at the transmitting electrical system.

Alternatively, the listening electrical system may simply transmit a confirmation message to the transmitting electrical system over a bidirectional OOB channel, upon receiving which the transmitting electrical system may cease transmitting a beacon/error message/SOS signal.

Furthermore, depending on the in-band communication failure and available functionality of the transmitting and listening electrical systems it may be possible to establish a hybrid bidirectional channel, where one path (from transmitting electrical system to listening electrical system or vice versa) utilizes an in-band communication mechanism while the other path utilizes an OOB communication mechanism. For example, a transmitting electrical system such as a remote vehicle or device may be equipped with an in-band transmitter and receiver, while the listening electrical system is equipped with a counterpart in-band transmitter and receiver to communicate with the transmitting electrical system. In a scenario where the in-band transmitter at the transmitting electrical system fails but the in-band receiver at the transmitting electrical system remains operational. Accordingly, the transmitting electrical system may remain capable of receiving in-band communications with the in-band receiver but may need to resort to transmitting with an OOB communication mechanism. Accordingly, the listening electrical system may transmit with an in-band communication mechanism while receiving with an OOB communication mechanism, thus creating a hybrid bidirectional channel (which may alternatively be reversed with respect to which path is the in-band path and which path is the OOB path). In a hybrid bidirectional context, the transmitting electrical system may transmit an initial beacon/error message/SOS signal that informs the listening electrical system that the transmitting electrical system will commence utilizing a hybrid bidirectional channel for communications.

Alternatively, the listening electrical system may receive a message from the transmitting electrical system as a beacon, error message, or SOS signal over a unidirectional OOB communication channel. The message may thus be a one-off message, and accordingly the listening electrical system may simply collect the transmitted message and e.g. save the message as a log or provide the message to an operator.

Alternatively, the listening electrical system may attempt troubleshooting in order to potentially fix the in-band communication channel upon receiving an error message or SOS signal from the transmitting electrical system. For example, the listening electrical system may attempt to determine whether the in-band communication failure occurred at the listening electrical system side, and accordingly may attempt troubleshooting or request a repair. Alternatively, the listening electrical system may request repair on behalf of the transmitting electrical system, which may be possible depending on the remote location of the transmitting electrical system.

Accordingly, an operator may have appreciable flexibility in determining the specific configuration of the OOB communication mechanism. Both the transmitting and listening electrical systems may be preconfigured to utilize a particular OOB communication configuration, which may be necessary in order to ensure that the transmitting and listening electrical systems are using both using a compatible OOB communication mechanism.

In addition the thermal, EMI, acoustic, and power supply OOB communications detailed above, electrical systems may additionally utilize optical OOB communications. In particular, in an intra-system OOB communication context a first CPU such as CPU1 may provide control to an optical output device such as a liquid-crystal display (LCD) device, and accordingly may be able to control the LCD device to vary an emitted optical signal. A second CPU such as CPU2 may be equipped with an optical sensor, which CPU2 may be able to utilize in order to detect variations in the optical signal emitted by the LCD device over time. Accordingly, CPU1 may be able to modulate a data sequence as an optical signal, such as a sequence of optical pulses or even as more complex predefined optical signal displayed on the LCD device (which may depend on the display capabilities of the LCD device). CPU1 and CPU2 may employ optical OOB communications to transmit diagnostic info after a failure of the in-band communication channel has been detected. Both intra-system and inter-system optical OOB communications based on optical display devices may be similarly adopted for use as an OOB communication mechanism within or between electrical systems.

The transmitting and listening electrical systems may additionally implement duplexing schemes between transmitting and receiving in order to perform OOB communications. In configurations where both the transmitting and listening electrical systems are capable of transmitting and receiving OOB communications, the transmitting and listening electrical systems may utilize a half-duplexing or full-duplexing scheme in order to support bi-directional OOB communications, such as by employing a time-division duplexing in which the transmitting and listening electrical systems alternate between transmitting or a frequency-division duplexing scheme in which the transmitting and listening electrical systems transmit with orthogonal or separate carrier frequencies. Alternatively, the transmitting and listening electrical systems may utilize a code-division scheme to support bi-directional communications.

Multiple access schemes may also be considered, such as where two transmitting electrical systems utilize OOB communications to transmit OOB communication data to a single listening electrical system. Accordingly, the two transmitting electrical systems may employ a multiple access scheme such as Time Division Multiple Access (TDMA), Frequency Division Multiple Access (FDMA), Code Division Multiple Access (CDMA), Orthogonal Frequency Division Multiple Access (OFDMA), etc. It is understood that a wide-range of different multi-point configurations based on established multi-point communication systems may be implemented in such a scenario, such as utilizing.

Furthermore, while the examples detailed above may focus on a single OOB communication channel between electrical systems, certain electrical systems may be capable of utilizing two or more OOB communication channels at a given time, which may be utilized in order to increase reliability, enable bidirectional OOB communication, and/or increase throughput. For example, the transmitting electrical system may employ both thermal and power supply OOB communications to utilize two separate OOB communication channels to communicate with the listening electrical system (assuming the listening electrical system is capable of receiving at least both thermal and power supply OOB communications). The transmitting electrical system may transmit similar data, e.g. the same data message, on both the thermal and power supply OOB communication channels in order to improve transmission reliability. Alternatively, the transmitting electrical system may utilize multiple OOB communication channels in order to transmit different data (or e.g. different sections of data from the same data message or stream) on each OOB communication channel in order to improve reliability. Alternatively, the transmitting and listening electrical system may utilize two or more OOB communication channels to support bidirectional OOB communications, e.g. where the transmitting electrical system uses a first OOB communication channel to transmit OOB data while the listening electrical system uses a second OOB communication channel to transmit OOB data.

The above descriptions have included references to actions and decisions by processors (specifically CPUs) that may control additionally other electrical components. It is understood that all such descriptions refer to the operation of a processor in response to control logic provided by executed software and/or firmware modules. For example, each processor may retrieve program code for a software and/or firmware module from a memory (not explicitly shown) and execute the software and/or firmware modules. The processor may then perform actions and decisions in accordance with the control logic provided by the software and/or firmware modules, thus performing a variety of operations in additionally to controlling other components.

Figure 6:
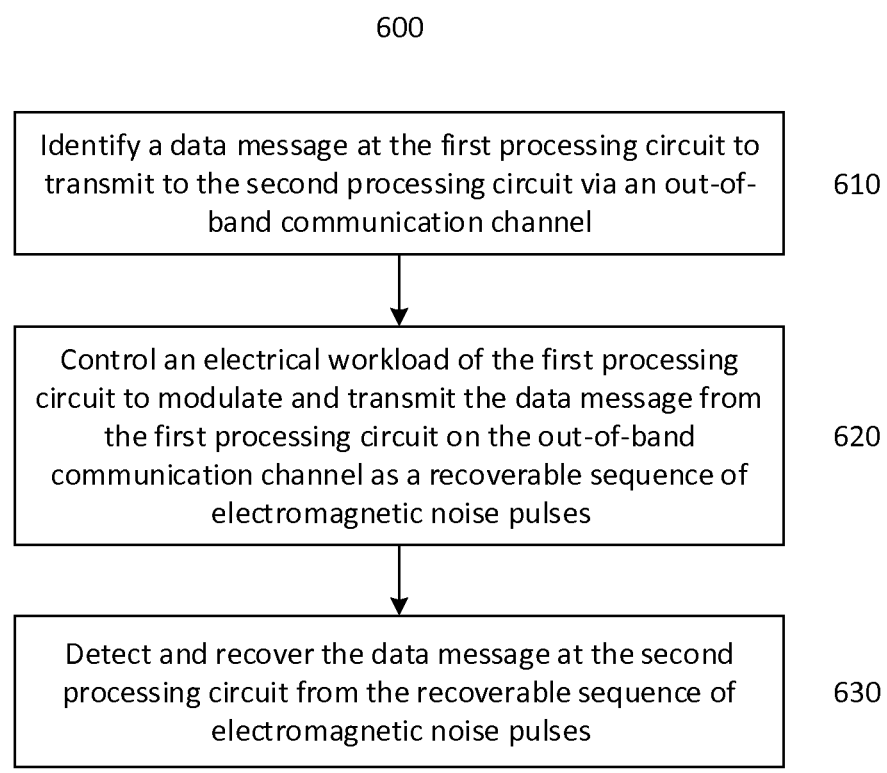
FIG. 6 shows a flow chart illustrating a method for performing EMI out-of-band communications.

FIG. 6 shows method 600 for performing out-of-band communications between a first processing circuit and a second processing circuit. Method 600 includes identifying a data message at the first processing circuit to transmit to the second processing circuit via an out-of-band communication channel (610), controlling an electrical workload of the first processing circuit to modulate and transmit the data message from the first processing circuit on the out-of-band communication channel as a recoverable sequence of electromagnetic noise pulses (620), and detecting and recovering the data message at the second processing circuit from the recoverable sequence of electromagnetic noise pulses (630).

In one or more further exemplary aspects of the disclosure, one or more of the features described above in reference to FIGS. 1-5 may be further incorporated into method 600. In particular, method 600 may be configured to perform further and/or alternate processes as detailed regarding electrical system 100 and/or electrical system 500.

Figure 7:
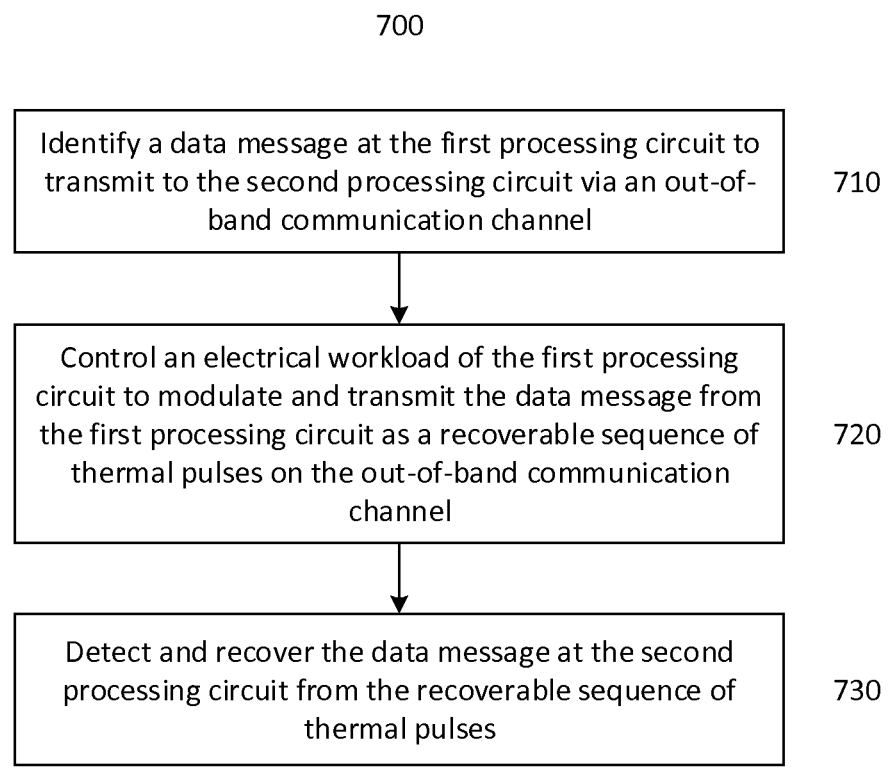
FIG. 7 shows a flow chart illustrating a method for performing thermal out-of-band communications.

FIG. 7 shows method 700 for performing out-of-band communications between a first processing circuit and a second processing circuit. Method 700 includes identifying a data message at the first processing circuit to transmit to the second processing circuit via an out-of-band communication channel (710), controlling an electrical workload of the first processing circuit to modulate and transmit the data message from the first processing circuit as a recoverable sequence of thermal pulses on the out-of-band communication channel (720), and detecting and recovering the data message at the second processing circuit from the recoverable sequence of thermal pulses (730).

In one or more further exemplary aspects of the disclosure, one or more of the features described above in reference to FIGS. 1-5 may be further incorporated into method 700. In particular, method 700 may be configured to perform further and/or alternate processes as detailed regarding electrical system 100 and/or electrical system 500.

Figure 8:
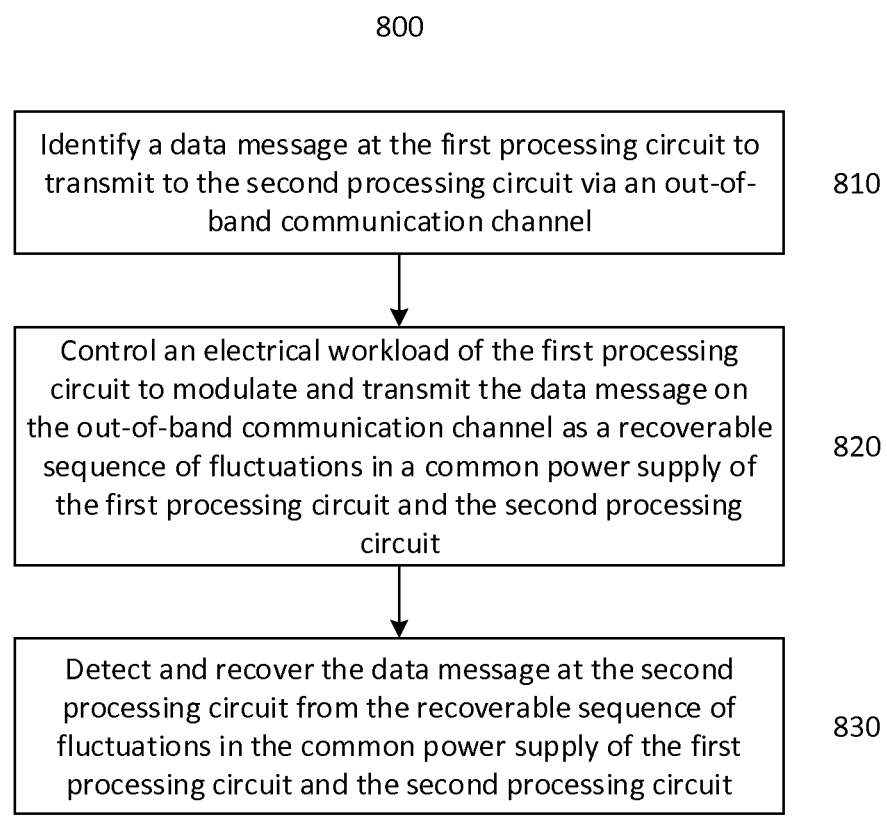
FIG. 8 shows a flow chart illustrating a method for performing power supply current/voltage out-of-band communications.

FIG. 8 shows method 800 for performing out-of-band communications between a first processing circuit and a second processing circuit. Method 800 includes identifying a data message at the first processing circuit to transmit to the second processing circuit via an out-of-band communication channel (810), controlling an electrical workload of the first processing circuit to modulate and transmit the data message on the out-of-band communication channel as a recoverable sequence of fluctuations in a common power supply of the first processing circuit and the second processing circuit (820), and detecting and recovering the data message at the second processing circuit from the recoverable sequence of fluctuations in the common power supply of the first processing circuit and the second processing circuit (830).

In one or more further exemplary aspects of the disclosure, one or more of the features described above in reference to FIGS. 1-5 may be further incorporated into method 800. In particular, method 800 may be configured to perform further and/or alternate processes as detailed regarding electrical system 400.

Figure 9:
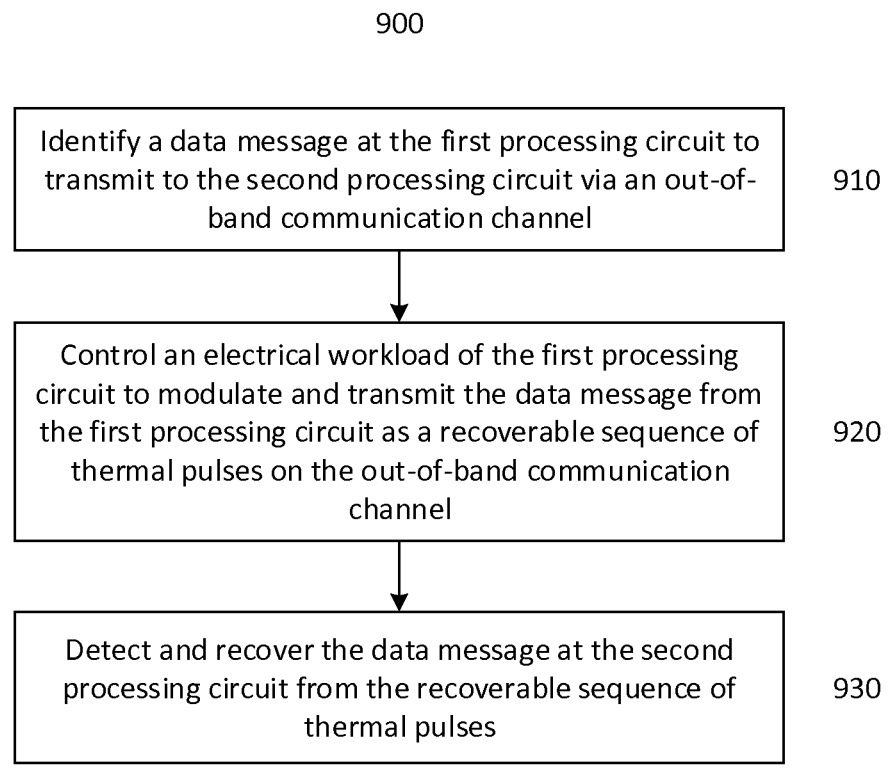
FIG. 9 shows a flow chart illustrating a method for performing acoustic out-of-band communications.

FIG. 9 shows method 900 for performing out-of-band communications between a first processing circuit and a second processing circuit. Method 900 includes identifying a data message at the first processing circuit to transmit to the second processing circuit via an out-of-band communication channel (910), controlling a system workload of a cooling device connected to the first processing circuit to modulate and transmit the data message on the out-of-band communication channel as a recoverable sequence of acoustic pulses emitted by the cooling device (920), and detecting and recovering the data message at the second processing circuit from the recoverable sequence of acoustic pulses (930).

In one or more further exemplary aspects of the disclosure, one or more of the features described above in reference to FIGS. 1-5 may be further incorporated into method 700. In particular, method 700 may be configured to perform further and/or alternate processes as detailed regarding electrical system 300 and/or electrical system 500.

It is appreciated that the terms "user equipment", "UE", "mobile terminal", etc., may apply to any wireless communication device, including cellular phones, tablets, laptops, personal computers, and any number of additional electronic devices capable of wireless communications.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include a one or more components configured to perform each aspect of the related method.

All acronyms defined in the above description additionally hold in all claims included herein.

The following examples pertain to further aspects of the disclosure:

Example 1 is an electrical system including a processing circuit and one or more electrical components that generate electromagnetic noise, wherein the processing circuit is configured to identify signal degradation or failure of an in-band communication channel between the electrical system and a second electrical system, identify a data message to transmit to the second electrical system via an out-of-band communication channel, and direct the one or more electrical components to adjust an electrical workload to modulate and transmit the data message on the out-of-band communication channel as a recoverable sequence of electromagnetic noise pulses.

In Example 2, the subject matter of Example 1 can optionally include wherein the processing circuit is configured to direct the one or more electrical components to adjust the electrical workload of the one or more electrical components to modulate and transmit the data message on the out-of-band communication channel as a recoverable sequence of electromagnetic noise pulses by increasing and decreasing a clock frequency of the one or more electrical components to vary electromagnetic noise emitted by the one or more electrical components.

In Example 3, the subject matter of Example 1 or 2 can optionally include the processing circuit is configured to direct the one or more electrical components to adjust the electrical workload to modulate and transmit the data message on the out-of-band communication channel as a recoverable sequence of electromagnetic noise pulses by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 4, the subject matter of any one of Examples 1 to 3 can optionally include wherein the processing circuit is configured to direct the one or more electrical components to adjust the electrical workload to modulate and transmit the data message on the out-of-band communication channel as a recoverable sequence of electromagnetic noise pulses by modulating the data message with an error correction, error detection, or authentication scheme.

In Example 5, the subject matter of any one of Examples 1 to 4 can optionally include wherein the processing circuit is further configured to direct one or more additional electrical components of the electrical system to stabilize the amount of electromagnetic noise emitted by the one or more additional components at a precalibrated level.

In Example 6, the subject matter of any one of Examples 1 to 5 can optionally include wherein the processing circuit is further configured to determine a binary data sequence corresponding to the data message and to modulate and transmit the data message on the out-of-band communication channel as a recoverable sequence of electromagnetic noise pulses by directing the one or more electrical components to increase and decrease the electrical workload of the one or more electrical components according to one or more logical transitions in the binary data sequence to modulate and transmit the data message on the out-of-band communication channel.

In Example 7, the subject matter of any one of Examples 1 to 6 can optionally further include an electromagnetic noise sensor configured to detect and demodulate an additional recoverable sequence of electromagnetic noise pulses to recover an additional data message transmitted by the second electrical system on the out-of-band communication channel.

In Example 8, the subject matter of any one of Examples 1 to 7 can optionally include wherein the processing unit is configured to identify a data message to transmit to the second electrical system via an out-of-band communication channel by identifying a predefined data message as the data message.

In Example 9, the subject matter of any one of Examples 1 to 7 can optionally include wherein the processing circuit is configured to identify a data message to transmit to the second electrical system via an out-of-band communication channel by identifying a data message that contains information of the of the signal degradation or failure of the in-band communication channel.

In Example 10, the subject matter of any one of Examples 1 to 9 can optionally include wherein the processing circuit is configured to identify that an in-band communication channel between the electrical system and a second electrical system has deteriorated or failed includes performing a system status check to determine whether communications over the in-band communication channel is deteriorated or failed.

Example 11 is an electrical system including a first processing circuit and a second processing circuit, wherein the first processing circuit is configured to identify a data message to transmit to the second processing circuit via an out-of-band communication channel, and control an electrical workload of the first processing circuit to modulate and transmit the data message on the out-of-band communication channel as a recoverable sequence of electromagnetic noise pulses, and wherein the second processing circuit is configured to detect and recover the data message from the recoverable sequence of electromagnetic noise pulses.

In Example 12, the subject matter of Example 11 can optionally include wherein the first processing circuit or the second processing circuit is further configured to identify signal degradation or failure of an in-band communication channel between the first processing circuit and the second processing circuit.

In Example 13, the subject matter of Example 12 can optionally include wherein the second processing circuit or the first processing circuit is configure to identify signal degradation or failure of an in-band communication channel between the first processing circuit and the second processing circuit by performing a system status check to determine whether communications over the in-band communication channel is deteriorated or failed.

In Example 14, the subject matter of any one of Examples 11 to 13 can optionally further include an electromagnetic noise sensor connected to the second processing circuit, wherein the second processing circuit is configured to detect the recoverable sequence of electromagnetic noise pulses with the electromagnetic noise sensor.

In Example 15, the subject matter of any one of Examples 11 to 14 can optionally include wherein the second processing circuit is configured to detect and recover the data message from the recoverable sequence of electromagnetic noise pulses by demodulating the recoverable sequence of electromagnetic noise pulses according to a predetermined modulation configuration to recover the data message.

In Example 16, the subject matter of Example 15 can optionally include wherein the second processing circuit is configured to demodulate the recoverable sequence of electromagnetic noise pulses according to a predetermined modulation configuration to recover the data message by demodulating the recoverable sequence of electromagnetic noise pulses according to one or more of a predetermined modulation scheme, predetermined coding rate, predetermined error correction scheme, predetermined error detection scheme, or a predetermined authentication scheme.

In Example 7, the subject matter of Example 11 can optionally further include an electromagnetic noise sensor connected to the first processing circuit.

In Example 18, the subject matter of Example 11 can optionally include wherein the second processing circuit is further configured to control the electrical workload of the second processing circuit to modulate and transmit an additional data message to the first processing circuit on the out-of-band communication channel as an additional recoverable sequence of electromagnetic noise pulses.

In Example 9, the subject matter of Example 18 can optionally further include an electromagnetic noise sensor connected to the first processing circuit, wherein the first processing circuit is further configured to detect and recover the additional data message from the additional recoverable sequence of electromagnetic noise pulses with the electromagnetic noise sensor.

In Example 20, the subject matter of any one of Examples 11 to 19 can optionally include wherein the first processing circuit is configured to control an electrical workload of the first processing circuit to modulate and transmit the data message on the out-of-band communication channel as a recoverable sequence of electromagnetic noise pulses by increasing and decreasing a clock frequency of the first processing circuit to vary electromagnetic noise emitted by the first processing circuit.

In Example 21, the subject matter of any one of Examples 11 to 20 can optionally include wherein the first processing circuit is configured to control an electrical workload of the first processing circuit to modulate and transmit the data message on the out-of-band communication channel as a recoverable sequence of electromagnetic noise pulses by increasing and decreasing a number of executed computational operations of the first processing circuit to vary electromagnetic noise emitted by the first processing circuit.

In Example 22, the subject matter of any one of Examples 11 to 21 can optionally include wherein the first processing circuit is configured to control an electrical workload of the first processing circuit to modulate and transmit the data message on the out-of-band communication channel as a recoverable sequence of electromagnetic noise pulses by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 23, the subject matter of any one of Examples 11 to 22 can optionally include wherein the first processing circuit is configured to control an electrical workload of the first processing circuit to modulate and transmit the data message on the out-of-band communication channel as a recoverable sequence of electromagnetic noise pulses by modulating the data message with an error correction, error detection, or authentication scheme.

In Example 24, the subject matter of any one of Examples 11 to 23 can optionally include wherein the first processing circuit is further configured to determine a binary data sequence corresponding to the data message, and wherein the first processing circuit is configured to control an electrical workload of the first processing circuit to modulate and transmit the data message on the out-of-band communication channel as a recoverable sequence of electromagnetic noise pulses by directing the first processing circuit to increase and decrease the electrical workload of the first processing circuit according to one or more logical transitions in the binary data sequence to modulate and transmit the data message on the out-of-band communication channel.

In Example 25, the subject matter of any one of Examples 11 to 24 can optionally include wherein the first processing circuit is configured to identify a data message to transmit to the second processing circuit via an out-of-band communication channel by identifying a predefined data message as the data message.

In Example 26, the subject matter of any one of Examples 11 to 24 can optionally include wherein the first processing circuit is configured to identify a data message to transmit to the second processing circuit via an out-of-band communication channel by identifying an error message that contains information of the signal degradation or failure of the in-band communication channel as the data message.

Example 27 is an electrical system including a processing circuit and one or more electrical components that emit thermal heat energy, the processing circuit configured to identify signal degradation or failure of an in-band communication channel between the electrical system and a second electrical system, identify a data message to transmit to the second electrical system via an out-of-band communication channel, and direct the one or more electrical components to adjust an electrical workload to modulate and transmit the data message on the out-of-band communication channel as a recoverable sequence of thermal pulses.

In Example 28, the subject matter of Example 27 can optionally include wherein the processing circuit is configured to direct the one or more electrical components to adjust the electrical workload of the one or more electrical components to modulate and transmit the data message on the out-of-band communication channel as a recoverable sequence of thermal pulses by increasing and decreasing the electrical workload of the one or more electrical components to vary thermal energy emitted by the one or more electrical components.

In Example 29, the subject matter of Example 27 or 28 can optionally include wherein the processing circuit is configured to direct the one or more electrical components to adjust the electrical workload of the one or more electrical components to modulate and transmit the data message on the out-of-band communication channel as a recoverable sequence of thermal pulses by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 30, the subject matter of any one of Examples 27 to 29 can optionally include wherein the processing circuit is configured to direct the one or more electrical components to adjust the electrical workload of the one or more electrical components to modulate and transmit the data message on the out-of-band communication channel as a recoverable sequence of thermal pulses by modulating the data message with an error correction, error detection, or authentication scheme.

In Example 31, the subject matter of any one of Examples 27 to 30 can optionally include wherein the processing circuit is further configured to direct one or more additional electrical components of the electrical system to stabilize the amount of electromagnetic noise emitted by the one or more additional components at a precalibrated level.

In Example 32, the subject matter of any one of Examples 27 to 31 can optionally include wherein the processing circuit is further configured to determine a binary data sequence corresponding to the data message, and wherein the processing circuit is configured to direct the one or more electrical components to adjust the electrical workload of the one or more electrical components to modulate an transmit the data message on the out-of-band communication channel as a recoverable sequence of thermal pulses by directing the one or more electrical components to increase and decrease the electrical workload of the one or more electrical components according to one or more logical transitions in the binary data sequence to modulate and transmit the data message on the out-of-band communication channel.

In Example 33, the subject matter of any one of Examples 27 to 32 can optionally further include a thermal sensor configured to detect and demodulate an additional recoverable sequence of thermal pulses to recover an additional data message transmitted by the second electrical system on the out-of-band communication channel.

In Example 34, the subject matter of any one of Examples 27 to 33 can optionally include wherein the processing circuit is configured to identify a data message to transmit to the second electrical system via an out-of-band communication channel by identifying a predefined data message as the data message.

In Example 35, the subject matter of any one of Examples 27 to 33 can optionally include wherein the processing circuit is configured to identify a data message to transmit to the second electrical system via an out-of-band communication channel by identifying a data message that contains information of the signal degradation or failure of the in-band communication channel.

In Example 36, the subject matter of any one of Examples 27 to 35 can optionally include wherein the processing circuit is configured to identify signal degradation or failure of an in-band communication channel between the electrical system and a second electrical system by performing a system status check to determine whether communications over the in-band communication channel is deteriorated or failed.

Example 37 is an electrical system including a first processing circuit and a second processing circuit, wherein the first processing circuit is configured to identify a data message to transmit to the second processing circuit via an out-of-band communication channel, and control an electrical workload of the first processing circuit to modulate and transmit the data message as a recoverable sequence of thermal pulses on the out-of-band communication channel, and wherein the second processing circuit is configured to detect and recover the data message from the recoverable sequence of thermal pulses.

In Example 38, the subject matter of Example 37 can optionally include wherein the first processing circuit or the second processing circuit is further configured to identify signal degradation or failure of an in-band communication channel between the first processing circuit and the second processing circuit.

In Example 9, the subject matter of Example 38 can optionally include wherein the first processing circuit or the second processing circuit is configured to identify signal degradation or failure of an in-band communication channel between the first processing circuit and the second processing circuit by performing a system status check to determine whether communications over the in-band communication channel is deteriorated or failed.

In Example 40, the subject matter of any one of Examples 37 to 39 can optionally further include a thermal sensor connected to the second processing circuit, wherein the second processing circuit is configured to detect the recoverable sequence of thermal pulses with the thermal sensor.

In Example 41, the subject matter of any one of Examples 37 to 40 can optionally include wherein the second processing circuit is configured to detect and recover the data message from the recoverable sequence of thermal pulses by demodulating the recoverable sequence of thermal pulses according to a predetermined modulation configuration to recover the data message.

In Example 42, the subject matter of Example 41 can optionally include wherein the second processing circuit is configured to demodulate the recoverable sequence of thermal pulses according to a predetermined modulation configuration to recover the data message by demodulating the recoverable sequence of electromagnetic noise pulses according to one or more of a predetermined modulation scheme, predetermined coding rate, predetermined error correction scheme, predetermined error detection scheme, or a predetermined authentication scheme.

In Example 43, the subject matter of Example 37 can optionally further include a thermal sensor connected to the first processing circuit.

In Example 44, the subject matter of Example 37 can optionally include wherein the second processing circuit is further configured to control the electrical workload of the second processing circuit to modulate and transmit an additional data message to the first processing circuit on the out-of-band communication channel as an additional recoverable sequence of thermal pulses.

In Example 45, the subject matter of Example 44 can optionally further include a thermal sensor connected to the first processing circuit, wherein the first processing circuit is further configured to detect and recover the additional data message from the additional recoverable sequence of thermal pulses with the thermal sensor.

In Example 46, the subject matter of any one of Examples 37 to 45 can optionally include wherein the first processing circuit is configured to control an electrical workload of the first processing circuit to modulate and transmit the data message as a recoverable sequence of thermal pulses on the out-of-band communication channel by increasing and decreasing a number of executed computational operations of the first processing circuit to vary thermal energy emitted by the first processing circuit.

In Example 47, the subject matter of any one of Examples 37 to 46 can optionally include wherein the first processing circuit is configured to control an electrical workload of the first processing circuit to modulate and transmit the data message on the out-of-band communication channel as a recoverable sequence of thermal pulses by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 48, the subject matter of any one of Examples 37 to 47 can optionally include wherein the first processing circuit is configured to control an electrical workload of the first processing circuit to modulate and transmit the data message on the out-of-band communication channel as a recoverable sequence of thermal pulses by modulating the data message with an error correction, error detection, or authentication scheme.

In Example 49, the subject matter of any one of Examples 37 to 48 can optionally include wherein the first processing circuit is further configured to determine a binary data sequence corresponding to the data message, and wherein the first processing circuit is configured to control an electrical workload of the first processing circuit to modulate and transmit the data message as a recoverable sequence of thermal pulses on the out-of-band communication channel by directing the first processing circuit to increase and decrease the electrical workload of the first processing circuit according to one or more logical transitions in the binary data sequence to modulate and transmit the data message on the out-of-band communication channel.

In Example 50, the subject matter of any one of Examples 37 to 49 can optionally include wherein the first processing circuit is configured to identify a data message to transmit to the second processing circuit via an out-of-band communication channel by identifying a predefined data message as the data message.

In Example 51, the subject matter of any one of Examples 37 to 49 can optionally include wherein the first processing circuit is configured to identify a data message to transmit to the second processing circuit via an out-of-band communication channel by identifying an error message that contains information of the signal degradation or failure of the in-band communication channel as the data message.

Example 52 is an electrical system including a processing circuit and one or more electrical components that share a common power supply with a second electrical system, the processing circuit configured to identify signal degradation or failure of an in-band communication channel between the first electrical system and the second electrical system, identify a data message to transmit to the second electrical system via an out-of-band communication channel, and direct the one or more electrical components to adjust an electrical workload to modulate and transmit the data message on the out-of-band communication channel as a recoverable sequence of fluctuations in the common power supply of the first electrical system and the second electrical system.

In Example 53, the subject matter of Example 52 can optionally include wherein the processing circuit is configured to direct the one or more electrical components to adjust the electrical workload of the one or more electrical components to modulate and transmit the data message on the out-of-band communication channel as a recoverable sequence of fluctuations in the common power supply of the first electrical system and the second electrical system by increasing and decreasing the electrical workload of the one or more electrical components to vary a level of electrical power drawn from the common power supply.

In Example 54, the subject matter of Example 52 or 53 can optionally include wherein the processing circuit is configured to direct the one or more electrical components to adjust the electrical workload of the one or more electrical components to modulate and transmit the data message on the out-of-band communication channel as a recoverable sequence of fluctuations in the common power supply of the first electrical system and the second electrical system by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 55, the subject matter of any one of Examples 52 to 54 can optionally include wherein the processing circuit is configured to direct the one or more electrical components to adjust the electrical workload of the one or more electrical components to modulate and transmit the data message on the out-of-band communication channel as a recoverable sequence of fluctuations in the common power supply of the first electrical system and the second electrical system by modulating the data message with an error correction, error detection, or authentication scheme.

In Example 56, the subject matter of any one of Examples 52 to 55 can optionally include wherein the processing circuit is further configured to direct one or more additional electronic components of the electrical system to stabilize the amount of electrical power drawn from the common power supply at a precalibrated level.

In Example 57, the subject matter of any one of Examples 52 to 56 can optionally include wherein the processing circuit is further configured to determine a binary data sequence corresponding to the data message, and wherein the processing circuit is configured to direct the one or more electrical components to adjust the electrical workload of the one or more electrical components to modulate and transmit the data message on the out-of-band communication channel as a recoverable sequence of fluctuations in the common power supply of the first electrical system and the second electrical system by directing the one or more electrical components to increase and decrease the electrical workload of the one or more electrical components according to one or more logical transitions in the binary data sequence to modulate and transmit the data message on the out-of-band communication channel.

In Example 58, the subject matter of any one of Examples 52 to 57 can optionally further include a voltage sensor or current sensor configured to detect and demodulate an additional recoverable sequence of fluctuations in the common power supply to recover an additional data message transmitted by the second electrical system on the out-of-band communication channel.

In Example 59, the subject matter of any one of Examples 52 to 58 can optionally include wherein the processing circuit is configured to identify a data message to transmit to the second electrical system via an out-of-band communication channel by identifying a predefined data message as the data message.

In Example 60, the subject matter of any one of Examples 52 to 58 can optionally include wherein the processing circuit is configured to identify a data message to transmit to the second electrical system via an out-of-band communication channel by identifying a data message that contains information of the signal degradation or failure of the in-band communication channel.

In Example 61, the subject matter of any one of Examples 52 to 60 can optionally include wherein the processing circuit is configured to identify signal degradation or failure of an in-band communication channel between the electrical system and a second electrical system by performing a system status check to determine whether communications over the in-band communication channel is deteriorated or failed.

Example 62 is an electrical system including a first processing circuit and a second processing circuit, wherein the first processing circuit is configured to identify a data message to transmit to the second processing circuit via an out-of-band communication channel, and control an electrical workload of the first processing circuit to modulate and transmit the data message on the out-of-band communication channel as a recoverable sequence of fluctuations in a common power supply of the first processing circuit and the second processing circuit, and wherein the second processing circuit is configured to detect and recover the data message from the recoverable sequence of fluctuations in the common power supply of the first processing circuit and the second processing circuit.

In Example 63, the subject matter of Example 62 can optionally include wherein the first processing circuit or the second processing circuit is further configured to identify signal degradation or failure of an in-band communication channel between the first processing circuit and second processing circuit.

In Example 64, the subject matter of Example 63 can optionally include wherein the first processing circuit or the second processing circuit is configured to identify signal degradation or failure of an in-band communication channel between the first processing circuit and the second processing circuit has deteriorated or failed by performing a system status check to determine whether communications over the in-band communication channel is deteriorated or failed.

In Example 65, the subject matter of any one of Examples 62 to 64 can optionally further include a voltage sensor or a current sensor connected to the second processing circuit, wherein the second processing circuit is configured to detect the recoverable sequence of fluctuations in the common power supply with the voltage sensor or the current sensor.

In Example 66, the subject matter of any one of Examples 62 to 65 can optionally include wherein the second processing circuit is configured to detect and recover the data message from the recoverable sequence of fluctuations in the common power supply by demodulating the recoverable sequence of fluctuations in the common power supply according to a predetermined modulation configuration to recover the data message.

In Example 67, the subject matter of Example 66 can optionally include wherein the second processing circuit is configured to demodulate the recoverable sequence of fluctuations in the common power supply according to a predetermined modulation configuration to recover the data message by demodulating the recoverable sequence of electromagnetic noise pulses according to one or more of a predetermined modulation scheme, predetermined coding rate, predetermined error correction scheme, predetermined error detection scheme, or a predetermined authentication scheme.

In Example 68, the subject matter of Example 62 can optionally further include a voltage sensor or a current sensor connected to the first processing circuit.

In Example 69, the subject matter of Example 62 can optionally include wherein the second processing circuit is further configured to control the electrical workload of the second processing circuit to modulate and transmit an additional data message to the first processing circuit on the out-of-band communication channel as an additional recoverable sequence of fluctuations in the common power supply.

In Example 70, the subject matter of Example 69 can optionally further include a voltage sensor or a current sensor connected to first processing circuit, wherein the first processing circuit is further configured to detect and recover the additional data message from the additional recoverable sequence of fluctuations in the common power supply with the voltage sensor or the current sensor.

In Example 71, the subject matter of any one of Examples 62 to 70 can optionally include wherein the first processing circuit is configured to control an electrical workload of the first processing circuit to modulate and transmit the data message on the out-of-band communication channel as a recoverable sequence of fluctuations in the common power supply by increasing and decreasing a number of executed computational operations of the first processing circuit to vary electrical power drawn from the common power supply by the first processing circuit.

In Example 72, the subject matter of any one of Examples 62 to 71 can optionally include wherein the first processing circuit is configured to control an electrical workload of the first processing circuit to modulate and transmit the data message on the out-of-band communication channel as a recoverable sequence of fluctuations in the common power supply by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 73, the subject matter of any one of Examples 62 to 72 can optionally include wherein the first processing circuit is configured to control an electrical workload of the first processing circuit to modulate and transmit the data message on the out-of-band communication channel as a recoverable sequence of fluctuations in the common power supply by modulating the data message with an error correction, error detection, or authentication scheme.

In Example 74, the subject matter of any one of Examples 62 to 73 can optionally include wherein the first processing circuit is further configured to determine a binary data sequence corresponding to the data message, and wherein the first processing circuit is configured to control an electrical workload of the first processing circuit to modulate and transmit the data message on the out-of-band communication channel as a recoverable sequence of fluctuations in the common power supply by directing the first processing circuit to increase and decrease the electrical workload of the first processing circuit according to one or more logical transitions in the binary data sequence to modulate and transmit the data message on the out-of-band communication channel.

In Example 75, the subject matter of any one of Examples 62 to 74 can optionally include wherein the first processing circuit is configured to identify a data message to transmit to the second processing circuit via an out-of-band communication channel by identifying a predefined data message as the data message.

In Example 76, the subject matter of any one of Examples 62 to 75 can optionally include wherein the first processing circuit is configured to identify a data message to transmit to the second processing circuit via an out-of-band communication channel by identifying an error message that contains information of the signal degradation or failure of the in-band communication channel as the data message.

Example 77 is an electrical system including a processing circuit and a cooling device, the processing circuit configured to identify signal degradation or failure of an in-band communication channel between the first electrical system and a second electrical system, identify a data message to transmit to the second electrical system via an out-of-band communication channel, and direct the cooling device to adjust an activity level of the cooling device to modulate and transmit the data message on the out-of-band communication channel as a recoverable sequence of acoustic pulses emitted by the cooling device.

In Example 78, the subject matter of Example 77 can optionally include wherein the processing circuit is configured to directly control the activity level of the cooling device, and wherein the processing circuit is configured to direct the cooling device to adjust an activity level of the cooling device to modulate and transmit the data message on the out-of-band communication channel as a recoverable sequence of acoustic pulses emitted by the cooling device by directing the cooling device to activate and deactivate in order to emit the recoverable sequence of acoustic pulses.

In Example 79, the subject matter of Example 77 can optionally include wherein the processing circuit is configured to direct the cooling device to adjust an activity level of the cooling device to modulate and transmit the data message on the out-of-band communication channel as a recoverable sequence of acoustic pulses emitted by the cooling device by increasing and decreasing a system workload of the processing circuit to increase and decrease a temperature of the processing circuit.

In Example 80, the subject matter of Example 79 can optionally include wherein the cooling device is configured to activate and deactivate in response to the temperature of the processing circuit to prevent overheating of the processing circuit.

In Example 81, the subject matter of Example 77 can optionally include wherein the processing circuit is configured to direct the cooling device to adjust an activity level of the cooling device to modulate and transmit the data message on the out-of-band communication channel as a recoverable sequence of acoustic pulses emitted by the cooling device by increasing and decreasing the activity level of the cooling device to vary acoustic energy emitted by the cooling device.

In Example 82, the subject matter of Example 77 or 81 can optionally include wherein the processing circuit is configured to direct the cooling device to adjust an activity level of the cooling device to modulate and transmit the data message on the out-of-band communication channel as a recoverable sequence of acoustic pulses emitted by the cooling device by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 83, the subject matter of any one of Examples 77 to 82 can optionally include wherein the processing circuit is configured to direct the cooling device to adjust an activity level of the cooling device to modulate and transmit the data message on the out-of-band communication channel as a recoverable sequence of acoustic pulses emitted by the cooling device by modulating the data message with an error correction, error detection, or authentication scheme.

In Example 84, the subject matter of any one of Examples 77 to 83 can optionally include wherein the processing circuit is further configured to direct one or more additional components of the electrical system to stabilize the amount of acoustic energy emitted by the one or more additional components at a precalibrated level.

In Example 85, the subject matter of any one of Examples 77 to 84 can optionally include wherein the processing circuit is further configured to determine a binary data sequence corresponding to the data message, and wherein the processing circuit is configured to direct the cooling device to adjust an activity level of the cooling device to modulate and transmit the data message on the out-of-band communication channel as a recoverable sequence of acoustic pulses emitted by the cooling device by directing the cooling device to increase and decrease an activity level of the cooling device according to one or more logical transitions in the binary data sequence to modulate and transmit the data message on the out-of-band communication channel.

In Example 86, the subject matter of any one of Examples 77 to 85 can optionally further include an acoustic sensor configured to detect and demodulate an additional recoverable sequence of acoustic pulses to recover an additional data message transmitted by the second electrical system on the out-of-band communication channel.

In Example 87, the subject matter of any one of Examples 77 to 86 can optionally include wherein the processing circuit is configured to identify a data message to transmit to the second electrical system via an out-of-band communication channel by identifying a predefined data message as the data message.

In Example 88, the subject matter of any one of Examples 77 to 86 can optionally include wherein the processing circuit is configured to identify a data message to transmit to the second electrical system via an out-of-band communication channel by identifying a data message that contains information of the signal degradation or failure of the in-band communication channel.

In Example 89, the subject matter of any one of Examples 77 to 88 can optionally include wherein the processing circuit is configured to identify signal degradation or failure of an in-band communication channel between the electrical system and a second electrical system by performing a system status check to determine whether communications over the in-band communication channel is deteriorated or failed.

Example 90 is an electrical system including a first processing circuit, a second processing circuit, and a cooling device, wherein the first processing circuit is configured to identify a data message to transmit to the second processing circuit via an out-of-band communication channel, and direct the cooling device to modulate and transmit the data message on the out-of-band communication channel as a recoverable sequence of acoustic pulses emitted by the cooling device, and wherein the second processing circuit is configured to detect and recover the data message from the recoverable sequence of acoustic pulses.

In Example 91, the subject matter of Example 90 can optionally include wherein the first processing circuit is configured to directly control operation of the cooling device, and wherein the first processing circuit is configured to direct the cooling device to modulate and transmit the data message on the out-of-band communication channel as a recoverable sequence of acoustic pulses emitted by the cooling device by directly controlling the cooling device to activate and deactivate to emit the recoverable sequence of acoustic pulses.

In Example 92, the subject matter of Example 90 can optionally include wherein the first processing circuit is configured to direct the cooling device to modulate and transmit the data message on the out-of-band communication channel as a recoverable sequence of acoustic pulses emitted by the cooling device by increasing and decreasing a system workload of the processing circuit in order to increase and decrease a temperature of the processing circuit.

In Example 3, the subject matter of Example 92 can optionally include wherein the cooling device is configured to activate and deactivate in response to the temperature of the processing circuit to prevent overheating of the processing circuit.

In Example 94, the subject matter of Example 90 can optionally include wherein the first processing circuit or the second processing circuit is further configured to identify signal degradation or failure of an in-band communication channel between the first processing circuit and the second processing circuit.

In Example 95, the subject matter of Example 94 can optionally include wherein the first processing circuit or the second processing circuit is configured to identify signal degradation or failure of an in-band communication channel between the first processing circuit and the second processing circuit by performing a system status check to determine whether communications over the in-band communication channel is deteriorated or failed.

In Example 96, the subject matter of Example 90 or 95 can optionally further include an acoustic sensor connected to the second processing circuit, wherein the second processing circuit is configured to detect the recoverable sequence of acoustic pulses with the acoustic sensor.

In Example 97, the subject matter of any one of Examples 90 to 96 can optionally include wherein the second processing circuit is configured to detect and recover the data message from the recoverable sequence of acoustic pulses by demodulating the recoverable sequence of acoustic pulses according to a predetermined modulation configuration to recover the data message.

In Example 98, the subject matter of Example 97 can optionally include wherein the second processing circuit is configured to demodulate the recoverable sequence of acoustic pulses according to a predetermined modulation configuration to recover the data message by demodulating the recoverable sequence of acoustic pulses according to one or more of a predetermined modulation scheme, predetermined coding rate, predetermined error correction scheme, predetermined error detection scheme, or a predetermined authentication scheme.

In Example 99, the subject matter of Example 90 can optionally further include an acoustic sensor connected to the first processing circuit.

In Example 100, the subject matter of Example 90 can optionally further include an additional cooling device connected to the second processing circuit, wherein the second processing circuit is further configured to direct the additional cooling device to modulate and transmit an additional data message to the first processing circuit on the out-of-band communication channel as an additional recoverable sequence of acoustic pulses emitted by the additional cooling device.

In Example 101, the subject matter of Example 100 can optionally further include an acoustic sensor connected to the first processing circuit, wherein the first processing circuit is further configured to detect and recover the additional data message from the additional recoverable sequence of acoustic pulses with the acoustic sensor.

In Example 102, the subject matter of any one of Examples 90 to 101 can optionally include wherein the cooling device is a fan, and wherein the first processing circuit is configured to direct the cooling device to modulate and transmit the data message on the out-of-band communication channel as a recoverable sequence of acoustic pulses by directing the fan to increase and decrease the air flow produced by the fan to vary acoustic energy emitted by the fan.

In Example 103, the subject matter of any one of Examples 90 to 102 can optionally include wherein the first processing circuit is configured to direct the cooling device to modulate and transmit the data message on the out-of-band communication channel as a recoverable sequence of acoustic pulses by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 104, the subject matter of any one of Examples 90 to 103 can optionally include wherein the first processing circuit is configured to direct the cooling device to modulate and transmit the data message on the out-of-band communication channel as a recoverable sequence of acoustic pulses by modulating the data message with an error correction, error detection, or authentication scheme.

In Example 105, the subject matter of any one of Examples 90 to 104 can optionally include wherein the first processing circuit is further configured to determine a binary data sequence corresponding to the data message, and wherein the first processing circuit is configured to direct the cooling device to modulate and transmit the data message on the out-of-band communication channel as a recoverable sequence of acoustic pulses by directing the cooling device to increase and decrease an activity level of the cooling device according to one or more logical transitions in the binary data sequence to modulate and transmit the data message on the out-of-band communication channel as a recoverable sequence of acoustic pulses.

In Example 106, the subject matter of any one of Examples 90 to 105 can optionally include wherein identifying a data message to transmit to the second processing circuit via an out-of-band communication channel includes identifying a predefined data message as the data message.

In Example 107, the subject matter of any one of Examples 90 to 105 can optionally include wherein the first processing circuit is configured to identify a data message to transmit to the second processing circuit via an out-of-band communication channel by identifying an error message that contains information of the signal degradation or failure of the in-band communication channel as the data message.

Example 108 is a method for performing out-of-band communications between a first processing circuit and a second processing circuit, the method including identifying a data message at the first processing circuit to transmit to the second processing circuit via an out-of-band communication channel, controlling an electrical workload of the first processing circuit to modulate and transmit the data message from the first processing circuit on the out-of-band communication channel as a recoverable sequence of electromagnetic noise pulses, and detecting and recovering the data message at the second processing circuit from the recoverable sequence of electromagnetic noise pulses.

In Example 109, the subject matter of Example 108 can optionally further include identifying at the first processing circuit or the second processing circuit that one or more in-band communication channels between the first processing circuit and the second processing circuit is deteriorated or failed.

In Example 110, the subject matter of Example 109 can optionally include wherein identifying at the first processing circuit or the second processing circuit that one or more in-band communication channels between the first processing circuit and the second processing circuit is deteriorated or failed includes performing a system status check to determine whether communications over the in-band communication channel is deteriorated or failed.

In Example 111, the subject matter of any one of Examples 108 to 110 can optionally further include detecting the recoverable sequence of electromagnetic noise pulses at the second processing circuit with an electromagnetic noise sensor.

In Example 112, the subject matter of any one of Examples 108 to 111 can optionally include wherein detecting and recovering the data message at the second processing circuit from the recoverable sequence of electromagnetic noise pulses includes demodulating the recoverable sequence of electromagnetic noise pulses according to a predetermined modulation configuration to recover the data message.

In Example 113, the subject matter of Example 112 can optionally include wherein demodulating the recoverable sequence of electromagnetic noise pulses according to a predetermined modulation configuration to recover the data message includes demodulating the recoverable sequence of electromagnetic noise pulses according to one or more of a predetermined modulation scheme, predetermined coding rate, predetermined error correction scheme, predetermined error detection scheme, or a predetermined authentication scheme.

In Example 114, the subject matter of Example 108 can optionally further include controlling the electrical workload of the second processing circuit to modulate and transmit an additional data message from the second processing circuit to the first processing circuit on the out-of-band communication channel as an additional recoverable sequence of electromagnetic noise pulses.

In Example 115, the subject matter of Example 114 can optionally further include detecting and recovering the additional data message at the first processing circuit from the additional recoverable sequence of electromagnetic noise pulses with an electromagnetic noise sensor.

In Example 116, the subject matter of any one of Examples 108 to 115 can optionally include wherein controlling an electrical workload of the first processing circuit to modulate and transmit the data message from the first processing circuit on the out-of-band communication channel as a recoverable sequence of electromagnetic noise pulses includes increasing and decreasing a clock frequency of the first processing circuit to vary electromagnetic noise emitted by the first processing circuit.

In Example 117, the subject matter of any one of Examples 108 to 115 can optionally include wherein controlling an electrical workload of the first processing circuit to modulate and transmit the data message from the first processing circuit on the out-of-band communication channel as a recoverable sequence of electromagnetic noise pulses includes increasing and decreasing a number of executed computational operations of the first processing circuit to vary electromagnetic noise emitted by the first processing circuit.

In Example 118, the subject matter of any one of Examples 108 to 117 can optionally include wherein controlling an electrical workload of the first processing circuit to modulate and transmit the data message from the first processing circuit on the out-of-band communication channel as a recoverable sequence of electromagnetic noise pulses includes modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 119, the subject matter of any one of Examples 108 to 118 can optionally include wherein controlling an electrical workload of the first processing circuit to modulate and transmit the data message from the first processing circuit on the out-of-band communication channel as a recoverable sequence of electromagnetic noise pulses includes modulating the data message with an error correction, error detection, or authentication scheme.

In Example 120, the subject matter of any one of Examples 108 to 119 can optionally further include determining a binary sequence corresponding to the data message at the first processing circuit, and wherein controlling an electrical workload of the first processing circuit to modulate and transmit the data message from the first processing circuit on the out-of-band communication channel as a recoverable sequence of electromagnetic noise pulses includes controlling the electrical workload of the first processing circuit to increase and decrease the electrical workload of the first processing circuit according to one or more logical transitions in the binary data sequence to modulate and transmit the data message from the first processing circuit on the out-of-band communication channel.

In Example 121, the subject matter of any one of Examples 108 to 120 can optionally include wherein identifying a data message at the first processing circuit to transmit to the second processing circuit via an out-of-band communication channel includes identifying a predefined data message as the data message.

In Example 122, the subject matter of any one of Examples 108 to 120 can optionally include wherein identifying a data message at the first processing circuit to transmit to the second processing circuit via an out-of-band communication channel includes identifying an error message that contains information of the deterioration or failure of the one or more in-band communication channels as the data message.

Example 123 is a method for performing out-of-band communications between a first processing circuit and a second processing circuit, the method including identifying a data message at the first processing circuit to transmit to the second processing circuit via an out-of-band communication channel, controlling an electrical workload of the first processing circuit to modulate and transmit the data message from the first processing circuit as a recoverable sequence of thermal pulses on the out-of-band communication channel, and detecting and recovering the data message at the second processing circuit from the recoverable sequence of thermal pulses.

In Example 124, the subject matter of Example 123 can optionally further include identifying at the first processing circuit or the second processing circuit that one or more in-band communication channels between the first processing circuit and the second processing circuit is deteriorated or failed.

In Example 125, the subject matter of Example 124 can optionally include wherein the identifying at the first processing circuit or the second processing circuit that one or more in-band communication channels between the first processing circuit and the second processing circuit is deteriorated or failed includes performing a system status check to determine whether communications over the one or more in-band communication channels is deteriorated or failed.

In Example 126, the subject matter of any one of Examples 123 to 125 can optionally further include detecting the recoverable sequence of thermal pulses at the second processing circuit with a thermal sensor.

In Example 127, the subject matter of any one of Examples 123 to 126 can optionally include wherein the detecting and recovering the data message at the second processing circuit from the recoverable sequence of thermal pulses includes demodulating the recoverable sequence of thermal pulses according to a predetermined modulation configuration to recover the data message.

In Example 128, the subject matter of Example 127 can optionally include wherein demodulating the recoverable sequence of thermal pulses according to a predetermined modulation configuration to recover the data message includes demodulating the recoverable sequence of electromagnetic noise pulses according to one or more of a predetermined modulation scheme, predetermined coding rate, predetermined error correction scheme, predetermined error detection scheme, or a predetermined authentication scheme.

In Example 129, the subject matter of Example 123 can optionally further include controlling the electrical workload of the second processing circuit to modulate and transmit an additional data message from the second processing circuit to the first processing circuit on the out-of-band communication channel as an additional recoverable sequence of thermal pulses.

In Example 130, the subject matter of Example 129 can optionally further include detecting and recovering the additional data message at the first processing circuit from the additional recoverable sequence of thermal pulses with a thermal sensor.

In Example 31, the subject matter of any one of Examples 123 to 130 can optionally include wherein controlling an electrical workload of the first processing circuit to modulate and transmit the data message from the first processing circuit as a recoverable sequence of thermal pulses on the out-of-band communication channel includes increasing and decreasing a number of executed computational operations of the first processing circuit to vary thermal energy emitted by the first processing circuit.

In Example 132, the subject matter of any one of Examples 123 to 131 can optionally include wherein controlling an electrical workload of the first processing circuit to modulate and transmit the data message from the first processing circuit on the out-of-band communication channel as a recoverable sequence of thermal pulses includes modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 33, the subject matter of any one of Examples 123 to 132 can optionally include wherein controlling an electrical workload of the first processing circuit to modulate and transmit the data message from the first processing circuit on the out-of-band communication channel as a recoverable sequence of thermal pulses includes modulating the data message with an error correction, error detection, or authentication scheme.

In Example 134, the subject matter of any one of Examples 123 to 133 can optionally further include determining a binary sequence corresponding to the data message at the first processing circuit, and wherein controlling an electrical workload of the first processing circuit to modulate and transmit the data message from the first processing circuit as a recoverable sequence of thermal pulses on the out-of-band communication channel includes directing the first processing circuit to increase and decrease the electrical workload of the first processing circuit according to one or more logical transitions in the binary data sequence to modulate and transmit the data message from the first processing circuit on the out-of-band communication channel.

In Example 35, the subject matter of any one of Examples 123 to 134 can optionally include wherein identifying a data message at the first processing circuit to transmit to the second processing circuit via an out-of-band communication channel includes identifying a predefined data message as the data message.

In Example 136, the subject matter of any one of Examples 123 to 134 can optionally include wherein identifying a data message at the first processing circuit to transmit to the second processing circuit via an out-of-band communication channel includes identifying an error message that contains information of the deterioration or failure of the one or more in-band communication channels as the data message.

Example 137 is a method for performing out-of-band communications between a first processing circuit and a second processing circuit, the method including identifying a data message at the first processing circuit to transmit to the second processing circuit via an out-of-band communication channel, controlling an electrical workload of the first processing circuit to modulate and transmit the data message on the out-of-band communication channel as a recoverable sequence of fluctuations in a common power supply of the first processing circuit and the second processing circuit, and detecting and recovering the data message at the second processing circuit from the recoverable sequence of fluctuations in the common power supply of the first processing circuit and the second processing circuit.

In Example 138, the subject matter of Example 137 can optionally further include identifying at the first processing circuit or the second processing circuit that one or more in-band communication channels between the first processing circuit and the second processing circuit is deteriorated or failed.

In Example 139, the subject matter of Example 138 can optionally include wherein identifying at the first processing circuit or the second processing circuit that one or more in-band communication channels between the first processing circuit and the second processing circuit is deteriorated or failed includes performing a system status check to determine whether communications over the one or more in-band communication channels is deteriorated or failed.

In Example 140, the subject matter of any one of Examples 137 to 139 can optionally further include detecting the recoverable sequence of fluctuations in the common power supply at the second processing circuit with voltage sensor or a current sensor.

In Example 141, the subject matter of any one of Examples 137 to 140 can optionally include wherein detecting and recovering the data message at the second processing circuit from the recoverable sequence of fluctuations in the common power supply includes demodulating the recoverable sequence of fluctuations in the common power supply according to a predetermined modulation configuration to recover the data message.

In Example 142, the subject matter of Example 141 can optionally include wherein demodulating the recoverable sequence of fluctuations in the common power supply according to a predetermined modulation configuration to recover the data message includes demodulating the recoverable sequence of electromagnetic noise pulses according to one or more of a predetermined modulation scheme, predetermined coding rate, predetermined error correction scheme, predetermined error detection scheme, or a predetermined authentication scheme.

In Example 143, the subject matter of Example 137 can optionally further include controlling the electrical workload of the second processing circuit to modulate and transmit an additional data message from the second processing circuit to the first processing circuit on the out-of-band communication channel as an additional recoverable sequence of fluctuations in the common power supply.

In Example 144, the subject matter of Example 143 can optionally further include detecting and recovering the additional data message at the first processing circuit from the additional recoverable sequence of fluctuations in the common power supply with a voltage sensor or power sensor.

In Example 145, the subject matter of any one of Examples 137 to 144 can optionally include wherein controlling an electrical workload of the first processing circuit to modulate and transmit the data message from the first processing circuit on the out-of-band communication channel as a recoverable sequence of fluctuations in the common power supply includes increasing and decreasing a number of executed computational operations of the first processing circuit to vary electrical power drawn from the common power supply by the first processing circuit.

In Example 146, the subject matter of any one of Examples 137 to 145 can optionally include wherein controlling an electrical workload of the first processing circuit to modulate and transmit the data message from the first processing circuit on the out-of-band communication channel as a recoverable sequence of fluctuations in the common power supply includes modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 147, the subject matter of any one of Examples 137 to 146 can optionally include wherein controlling an electrical workload of the first processing circuit to modulate and transmit the data message from the first processing circuit on the out-of-band communication channel as a recoverable sequence of fluctuations in the common power supply includes modulating the data message with an error correction, error detection, or authentication scheme.

In Example 148, the subject matter of any one of Examples 137 to 147 can optionally further include determining a binary data sequence at the first processing circuit corresponding to the data message, and wherein controlling an electrical workload of the first processing circuit to modulate and transmit the data message from the first processing circuit on the out-of-band communication channel as a recoverable sequence of fluctuations in the common power supply includes controlling the first processing circuit to increase and decrease the electrical workload of the first processing circuit according to one or more logical transitions in the binary data sequence to modulate and transmit the data message on the out-of-band communication channel.

In Example 149, the subject matter of any one of Examples 137 to 148 can optionally include wherein identifying a data message at the first processing circuit to transmit to the second processing circuit via an out-of-band communication channel includes identifying a predefined data message as the data message.

In Example 150, the subject matter of any one of Examples 137 to 148 can optionally include wherein identifying a data message at the first processing circuit to transmit to the second processing circuit via an out-of-band communication channel includes identifying an error message that contains information of the deterioration or failure of the one or more in-band communication channels as the data message.

Example 151 is a method for performing out-of-band communications between a first processing circuit and a second processing circuit, the method including identifying a data message at the first processing circuit to transmit to the second processing circuit via an out-of-band communication channel, controlling a cooling device for the first processing circuit to modulate and transmit the data message on the out-of-band communication channel as a recoverable sequence of acoustic pulses emitted by the cooling device, and detecting and recovering the data message at the second processing circuit from the recoverable sequence of acoustic pulses.

In Example 152, the subject matter of Example 151 can optionally include wherein the first processing circuit is configured to directly control operation of the cooling device, and wherein controlling a cooling device for the first processing circuit to modulate and transmit the data message on the out-of-band communication channel as a recoverable sequence of acoustic pulses emitted by the cooling device includes directly controlling the cooling device to activate and deactivate to emit the recoverable sequence of acoustic pulses.

In Example 153, the subject matter of Example 151 can optionally include wherein controlling a cooling device for the first processing circuit to modulate and transmit the data message on the out-of-band communication channel as a recoverable sequence of acoustic pulses emitted by the cooling device includes increasing and decreasing a system workload of the processing circuit in order to increase and decrease a temperature of the processing circuit.

In Example 154, the subject matter of Example 153 can optionally include wherein the cooling device is configured to activate and deactivate in response to the temperature of the processing circuit to prevent overheating of the processing circuit.

In Example 155, the subject matter of Example 151 can optionally further include identifying at the first processing circuit or the second processing circuit that one or more in-band communication channels between the first processing circuit and the second processing circuit is deteriorated or failed.

In Example 156, the subject matter of Example 155 can optionally include wherein identifying at the first processing circuit or the second processing circuit that one or more in-band communication channels between the first processing circuit and the second processing circuit is deteriorated or failed includes performing a system status check to determine whether communications over the one or more in-band communication channels is deteriorated or failed.

In Example 157, the subject matter of any one of Examples 151 to 156 can optionally further include detecting the recoverable sequence of acoustic pulses with an acoustic sensor.

In Example 158, the subject matter of any one of Examples 151 to 157 can optionally include wherein detecting and recovering the data message at the second processing circuit from the recoverable sequence of acoustic pulses includes demodulating the recoverable sequence of acoustic pulses according to a predetermined modulation configuration to recover the data message.

In Example 159, the subject matter of Example 158 can optionally include wherein demodulating the recoverable sequence of acoustic pulses according to a predetermined modulation configuration to recover the data message includes demodulating the recoverable sequence of acoustic pulses according to one or more of a predetermined modulation scheme, predetermined coding rate, predetermined error correction scheme, predetermined error detection scheme, or a predetermined authentication scheme.

In Example 160, the subject matter of Example 151 can optionally further include controlling an additional cooling device connected to the second processing circuit to modulate and transmit and additional data message to the first processing circuit on the out-of-band communication channel as an additional recoverable sequence of acoustic pulses emitted by the additional cooling device.

In Example 161, the subject matter of Example 160 can optionally further include detecting and recovering the additional data message from the additional recoverable sequence of acoustic pulses with the acoustic sensor.

In Example 162, the subject matter of any one of Examples 151 to 161 can optionally include wherein the cooling device is a fan, and wherein controlling a cooling device for the first processing circuit to modulate and transmit the data message on the out-of-band communication channel as a recoverable sequence of acoustic pulses includes controlling the fan to increase and decrease the air flow produced by the fan to vary acoustic energy emitted by the fan.

In Example 63, the subject matter of any one of Examples 151 to 162 can optionally include wherein controlling a cooling device for the first processing circuit to modulate and transmit the data message on the out-of-band communication channel as a recoverable sequence of acoustic pulses includes modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 64, the subject matter of any one of Examples 151 to 163 can optionally include wherein controlling a cooling device for the first processing circuit to modulate and transmit the data message on the out-of-band communication channel as a recoverable sequence of acoustic pulses includes modulating the data message with an error correction, error detection, or authentication scheme.

In Example 165, the subject matter of any one of Examples 151 to 164 can optionally further include determining a binary data sequence corresponding to the data message, and wherein controlling a cooling device for the first processing circuit to modulate and transmit the data message on the out-of-band communication channel as a recoverable sequence of acoustic pulses includes controlling the cooling device to increase and decrease an activity level of the cooling device according to one or more logical transitions in the binary data sequence to modulate and transmit the data message on the out-of-band communication channel as a recoverable sequence of acoustic pulses.

In Example 166, the subject matter of any one of Examples 151 to 165 can optionally include wherein identifying a data message at the first processing circuit to transmit to the second processing circuit via an out-of-band communication channel includes identifying a predefined data message as the data message.

In Example 167, the subject matter of any one of Examples 151 to 165 can optionally include wherein identifying a data message at the first processing circuit to transmit to the second processing circuit via an out-of-band communication channel includes identifying an error message that contains information of the deterioration or failure of the one or more in-band communication channels as the data message.

Example 168 is an electrical system including control means configured to identify signal degradation or failure of an in-band communication channel between the electrical system and a second electrical system and identify a data message to transmit to the second electrical system via an out-of-band communication channel, and generating means configured to adjust an electrical workload to modulate and transmit the data message on the out-of-band communication channel as a recoverable sequence of electromagnetic noise pulses.

In Example 169, the subject matter of Example 168 can optionally include wherein the generating means is configured to adjust the electrical workload to modulate and transmit the data message in response to control by the control means.

In Example 170, the subject matter of Example 168 can optionally include wherein the generating means is configured to increase and decrease a clock frequency of the generating means to vary the electromagnetic noise emitted by the generating means to modulate and transmit the data message.

In Example 171, the subject matter of any one of Examples 168 to 170 can optionally include wherein the generating means is configured to modulate the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK) to modulate and transmit the data message.

In Example 172, the subject matter of any one of Examples 168 to 171 can optionally include wherein the generating means is configured to modulate the data message with an error correction, error detection, or authentication scheme to modulate and transmit the data message.

In Example 173, the subject matter of any one of Examples 168 to 172 can optionally include wherein the control means is further configured to determine a binary data sequence corresponding to the data message, and wherein the generating means is configured to increase and decrease the electrical workload according to one or more logical transitions in the binary data sequence to modulate and transmit the data message.

In Example 174, the subject matter of any one of Examples 168 to 173 can optionally further include sensing means configured to detect and demodulate an additional recoverable sequence of electromagnetic pulses to recover an additional data message transmitted by the second electrical system on the out-of-band communication channel.

In Example 175, the subject matter of any one of Examples 168 to 174 can optionally include wherein the control means is configured to identify a predefined data message as the data message.

In Example 176, the subject matter of any one of Examples 168 to 174 can optionally include wherein the control means is configured to identify a predefined data message as the data message.

In Example 177, the subject matter of any one of Examples 168 to 174 can optionally include wherein the control means is configured to identify a data message that contains information of the signal degradation or failure of the in-band communication channel as the data message.

In Example 178, the subject matter of any one of Examples 168 to 177 can optionally include wherein the control means is configured to perform a system status check to determine whether communications over the in-band communication channel is deteriorated or failed.

Example 179 is an electrical system including control means configured to identify signal degradation or failure of an in-band communication channel between the electrical system and a second electrical system and identify a data message to transmit to the second electrical system via an out-of-band communication channel, and generating means configured to adjust an electrical workload to modulate and transmit the data message on the out-of-band communication channel as a recoverable sequence of thermal pulses.

In Example 180, the subject matter of Example 179 can optionally include wherein the generating means is configured to adjust the electrical workload to modulate and transmit the data message in response to control by the control means In Example 181, the subject matter of Example 179 or 180 can optionally include wherein the generating means is further configured to increase and decrease the electrical workload to vary thermal energy emitted by the generating means to modulate and transmit the data message.

In Example 182, the subject matter of any one of Examples 179 to 181 can optionally include wherein the generating means is further configured to modulate the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK) to modulate and transmit the data message to modulate and transmit the data message.

In Example 183, the subject matter of any one of Examples 179 to 182 can optionally include wherein the generating means is further configured to modulate the data message with an error correction, error detection, or authentication scheme to modulate and transmit the data message.

In Example 184, the subject matter of any one of Examples 179 to 183 can optionally include wherein the control means is configured to determine a binary data sequence corresponding to the data message, and wherein the generating means is configured to increase and decrease the electrical workload of the generating means according to one or more logical transitions in the binary data sequence to modulate and transmit the data message on the out-of-band communication channel.

In Example 185, the subject matter of any one of Examples 179 to 184 can optionally further include sensing means configured to detect and demodulate an additional recoverable sequence of thermal pulses to recover an additional data message transmitted by the second electrical system on the out-of-band communication channel.

In Example 186, the subject matter of any one of Examples 179 to 185 can optionally include where in the control means is configured to identify a predefined data message as the data message.

In Example 187, the subject matter of any one of Examples 179 to 185 can optionally include wherein the control means is configured to identify a data message that contains information of the signal degradation or failure of the in-band communication channel.

In Example 188, the subject matter of any one of Examples 179 to 187 can optionally include wherein the control means is configured to perform a system status check to determine whether communications over the in-band communication channel is deteriorated or failed.

Example 189 is an electrical system including control means configured to identify signal degradation or failure of an in-band communication channel between the first electrical system and the second electrical system and identify a data message to transmit to the second electrical system via an out-of-band communication channel, and generating means configured to adjust an electrical workload to modulate and transmit the data message on the out-of-band communication channel as a recoverable sequence of fluctuations in a common power supply of the first electrical system and the second electrical system.

In Example 190, the subject matter of Example 189 can optionally include wherein the generating means is configured to adjust the electrical workload to modulate and transmit the data message in response to control provided by the control means.

In Example 191, the subject matter of Example 189 or 190 can optionally include wherein the generating means is configured to increase and decrease the electrical workload of the generating means to vary a level of electrical power drawn from the common power supply.

In Example 192, the subject matter of any one of Examples 189 to 191 can optionally include wherein the generating means is configured to modulate the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK) to modulate and transmit the data message.

In Example 193, the subject matter of any one of Examples 189 to 192 can optionally include wherein the generating means is configured to modulate the data message with an error correction, error detection, or authentication scheme to modulate and transmit the data message.

In Example 194, the subject matter of any one of Examples 189 to 193 can optionally include wherein the control means is configured to determine a binary data sequence corresponding to the data message, and wherein the generating means is configured to increase and decrease the electrical workload of the generating means according to one or more logical transitions in the binary data sequence to modulate and transmit the data message on the out-of-band communication channel.

In Example 195, the subject matter of any one of Examples 189 to 194 can optionally further include sensing means configured to detect and demodulate an additional recoverable sequence of fluctuations in the common power supply to recover an additional data message transmitted by the second electrical system on the out-of-band communication channel.

In Example 196, the subject matter of any one of Examples 189 to 195 can optionally include wherein the control means is configured to identify a predefined data message as the data message.

In Example 197, the subject matter of any one of Examples 189 to 195 can optionally include wherein the control means is configured to identify a data message that contains information of the signal degradation or failure of the in-band communication channel.

In Example 198, the subject matter of any one of Examples 189 to 197 can optionally include wherein the control means is configured to perform a system status check to determine whether communication over the in-band communication channel is deteriorated or failed.

Example 199 is an electrical system including control means configured to identify signal degradation or failure of an in-band communication channel between the first electrical system and a second electrical system and identify a data message to transmit to the second electrical system via an out-of-band communication channel, and cooling means configured to adjust an activity level of the cooling means to modulate and transmit the data message on the out-of-band communication channel as a recoverable sequence of acoustic pulses emitted by the cooling device.

In Example 200, the subject matter of Example 199 can optionally include wherein the cooling means is configured to adjust the activity level to modulate and transmit the data message in response to control provided by the control means.

In Example 201, the subject matter of Example 199 or 200 can optionally include wherein the control means is configured to directly control the cooling means to direct the cooling device to activate and deactivate in order to emit the recoverable sequence of acoustic pulses.

In Example 202, the subject matter of Example 199 or 200 can optionally include wherein the control means is configured to increase and decrease a system workload of the control means to increase and decrease a temperature of the control means, and wherein the cooling means is configured to activate and deactivate in response to the temperature of the control means to prevent overheating of the control means.

In Example 203, the subject matter of any one of Examples 199 to 202 can optionally include wherein the cooling means is configured to modulate the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK) to modulate and transmit the data message.

In Example 204, the subject matter of any one of Examples 199 to 203 can optionally include wherein the cooling means is configured to modulate the data message with an error correction, error detection, or authentication scheme to modulate and transmit the data message.

In Example 205, the subject matter of any one of Examples 199 to 204 can optionally include wherein the control means is configured to determine a binary data sequence corresponding to the data message, and wherein the cooling means is configured to increase and decrease an activity level of the cooling means according to one or more logical transitions in the binary data sequence to modulate and transmit the data message on the out-of-band communication channel.

In Example 206, the subject matter of any one of Examples 199 to 205 can optionally further include sensing means configured to detect and demodulate an additional recoverable sequence of acoustic pulses to recover an additional data message transmitted by the second electrical system on the out-of-band communication channel.

In Example 207, the subject matter of any one of Examples 199 to 206 can optionally include wherein the control means is configured to identify a predefined message as the data message.

In Example 208, the subject matter of any one of Examples 199 to 207 can optionally include wherein the control means is configured to identify a data message that contains information of the signal degradation or failure of the in-band communication channel.

In Example 209, the subject matter of any one of Examples 199 to 208 can optionally include wherein the control means is configured to perform a system status check to determine whether communications over the in-band communication channel is deteriorated or failed.

Example 210 is an electrical system including a processing circuit and one or more electrical components that generate electromagnetic noise, wherein the processing circuit is configured to identify signal degradation or failure of an in-band communication channel between the electrical system and a second electrical system, and identify a data message to transmit to the second electrical system via an out-of-band communication channel, and wherein the one or more electrical components are configured to adjust an electrical workload to modulate and transmit the data message on the out-of-band communication channel as a recoverable sequence of electromagnetic noise pulses.

In Example 211, the subject matter of Example 210 can optionally include wherein the one or more electrical components are configured to adjust an electrical workload to modulate and transmit the data message on the out-of-band communication channel as a recoverable sequence of electromagnetic noise pulses by increasing and decreasing a clock frequency of the one or more electrical components to vary electromagnetic noise emitted by the one or more electrical components.

In Example 212, the subject matter of Example 210 or 211 can optionally include wherein the one or more electrical components are configured to adjust an electrical workload to modulate and transmit the data message on the out-of-band communication channel as a recoverable sequence of electromagnetic noise pulses by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 213, the subject matter of any one of Examples 210 to 212 can optionally include wherein the one or more electrical components are configured to adjust an electrical workload to modulate and transmit the data message on the out-of-band communication channel as a recoverable sequence of electromagnetic noise pulses by modulating the data message with an error correction, error detection, or authentication scheme.

In Example 214, the subject matter of any one of Examples 210 to 213 can optionally include wherein the processing circuit is further configured to direct one or more additional electrical components of the electrical system to stabilize the amount of electromagnetic noise emitted by the one or more additional components at a precalibrated level.

In Example 215, the subject matter of any one of Examples 210 to 214 can optionally include wherein the processing circuit is further configured to determine a binary data sequence corresponding to the data message, and wherein the one or more electrical are configured to adjust an electrical workload to modulate and transmit the data message on the out-of-band communication channel as a recoverable sequence of electromagnetic noise pulses by increasing and decreasing the electrical workload of the one or more electrical components according to one or more logical transitions in the binary data sequence to modulate and transmit the data message on the out-of-band communication channel.

In Example 216, the subject matter of any one of Examples 210 to 215 can optionally further include an electromagnetic noise sensor configured to detect and demodulate an additional recoverable sequence of electromagnetic noise pulses to recover an additional data message transmitted by the second electrical system on the out-of-band communication channel.

In Example 217, the subject matter of any one of Examples 210 to 216 can optionally include wherein the processing unit is configured to identify a data message to transmit to the second electrical system via an out-of-band communication channel by identifying a predefined data message as the data message.

In Example 218, the subject matter of any one of Examples 210 to 216 can optionally include wherein the processing circuit is configured to identify a data message to transmit to the second electrical system via an out-of-band communication channel by identifying a data message that contains information of the of the signal degradation or failure of the in-band communication channel.

In Example 219, the subject matter of any one of Examples 210 to 218 can optionally include wherein the processing circuit is configured to identify that an in-band communication channel between the electrical system and a second electrical system has deteriorated or failed includes performing a system status check to determine whether communications over the in-band communication channel is deteriorated or failed.

Example 220 is an electrical system including a processing circuit and one or more electrical components that emit thermal heat energy, the processing circuit configured to identify signal degradation or failure of an in-band communication channel between the electrical system and a second electrical system, and identify a data message to transmit to the second electrical system via an out-of-band communication channel, and wherein the one or more electrical components are configured to adjust an electrical workload to modulate and transmit the data message on the out-of-band communication channel as a recoverable sequence of thermal pulses.

In Example 221, the subject matter of Example 220 can optionally include wherein the one or more electrical components are configured to adjust an electrical workload to modulate and transmit the data message on the out-of-band communication channel as a recoverable sequence of thermal pulses by increasing and decreasing the electrical workload of the one or more electrical components to vary thermal energy emitted by the one or more electrical components.

In Example 222, the subject matter of Example 220 or 221 can optionally include wherein the one or more electrical components are configured to adjust an electrical workload to modulate and transmit the data message on the out-of-band communication channel as a recoverable sequence of thermal pulses by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 223, the subject matter of any one of Examples 220 to 222 can optionally include wherein the one or more electrical components are configured to adjust an electrical workload to modulate and transmit the data message on the out-of-band communication channel as a recoverable sequence of thermal pulses by modulating the data message with an error correction, error detection, or authentication scheme.

In Example 224, the subject matter of any one of Examples 220 to 223 can optionally include wherein the processing circuit is further configured to direct one or more additional electrical components of the electrical system to stabilize the amount of electromagnetic noise emitted by the one or more additional components at a precalibrated level.

In Example 225, the subject matter of any one of Examples 220 to 224 can optionally include wherein the processing circuit is further configured to determine a binary data sequence corresponding to the data message, and wherein the one or more electrical components are configured to adjust an electrical workload to modulate and transmit the data message on the out-of-band communication channel as a recoverable sequence of thermal pulses by increasing and decreasing the electrical workload of the one or more electrical components according to one or more logical transitions in the binary data sequence to modulate and transmit the data message on the out-of-band communication channel.

In Example 226, the subject matter of any one of Examples 220 to 225 can optionally further include a thermal sensor configured to detect and demodulate an additional recoverable sequence of thermal pulses to recover an additional data message transmitted by the second electrical system on the out-of-band communication channel.

In Example 227, the subject matter of any one of Examples 220 to 226 can optionally include wherein the processing circuit is configured to identify a data message to transmit to the second electrical system via an out-of-band communication channel by identifying a predefined data message as the data message.

In Example 228, the subject matter of any one of Examples 220 to 226 can optionally include wherein the processing circuit is configured to identify a data message to transmit to the second electrical system via an out-of-band communication channel by identifying a data message that contains information of the signal degradation or failure of the in-band communication channel.

In Example 229, the subject matter of any one of Examples 220 to 228 can optionally include wherein the processing circuit is configured to identify signal degradation or failure of an in-band communication channel between the electrical system and a second electrical system by performing a system status check to determine whether communications over the in-band communication channel is deteriorated or failed.

Example 230 is an electrical system including a processing circuit and one or more electrical components that share a common power supply with a second electrical system, the processing circuit configured to identify signal degradation or failure of an in-band communication channel between the first electrical system and the second electrical system, and identify a data message to transmit to the second electrical system via an out-of-band communication channel, and wherein the one or more electrical components are configured to adjust an electrical workload to modulate and transmit the data message on the out-of-band communication channel as a recoverable sequence of fluctuations in the common power supply of the first electrical system and the second electrical system.

In Example 231, the subject matter of Example 230 can optionally include wherein the one or more electrical components are configured to adjust an electrical workload to modulate and transmit the data message on the out-of-band communication channel as a recoverable sequence of fluctuations in the common power supply of the first electrical system and the second electrical system by increasing and decreasing the electrical workload of the one or more electrical components to vary a level of electrical power drawn from the common power supply.

In Example 232, the subject matter of Example 230 or 231 can optionally include wherein the one or more electrical components are configured to adjust an electrical workload to modulate and transmit the data message on the out-of-band communication channel as a recoverable sequence of fluctuations in the common power supply of the first electrical system and the second electrical system by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 233, the subject matter of any one of Examples 230 to 232 can optionally include wherein the one or more electrical components are configured to adjust an electrical workload to modulate and transmit the data message on the out-of-band communication channel as a recoverable sequence of fluctuations in the common power supply of the first electrical system and the second electrical system by modulating the data message with an error correction, error detection, or authentication scheme.

In Example 234, the subject matter of any one of Examples 230 to 233 can optionally include wherein the processing circuit is further configured to direct one or more additional electronic components of the electrical system to stabilize the amount of electrical power drawn from the common power supply at a precalibrated level.

In Example 235, the subject matter of any one of Examples 230 to 234 can optionally include wherein the processing circuit is further configured to determine a binary data sequence corresponding to the data message, and wherein the one or more electrical components are configured to adjust an electrical workload to modulate and transmit the data message on the out-of-band communication channel as a recoverable sequence of fluctuations in the common power supply of the first electrical system and the second electrical system by increasing and decreasing the electrical workload of the one or more electrical components according to one or more logical transitions in the binary data sequence to modulate and transmit the data message on the out-of-band communication channel.

In Example 236, the subject matter of any one of Examples 230 to 235 can optionally further include a voltage sensor or current sensor configured to detect and demodulate an additional recoverable sequence of fluctuations in the common power supply to recover an additional data message transmitted by the second electrical system on the out-of-band communication channel.

In Example 237, the subject matter of any one of Examples 230 to 236 can optionally include wherein the processing circuit is configured to identify a data message to transmit to the second electrical system via an out-of-band communication channel by identifying a predefined data message as the data message.

In Example 238, the subject matter of any one of Examples 230 to 236 can optionally include wherein the processing circuit is configured to identify a data message to transmit to the second electrical system via an out-of-band communication channel by identifying a data message that contains information of the signal degradation or failure of the in-band communication channel.

In Example 239, the subject matter of any one of Examples 230 to 238 can optionally include wherein the processing circuit is configured to identify signal degradation or failure of an in-band communication channel between the electrical system and a second electrical system by performing a system status check to determine whether communications over the in-band communication channel is deteriorated or failed.

Example 240 is an electrical system including a processing circuit and a cooling device, the processing circuit configured to identify signal degradation or failure of an in-band communication channel between the first electrical system and a second electrical system, and identify a data message to transmit to the second electrical system via an out-of-band communication channel, and wherein the cooling device is configured to adjust an activity level of the cooling device to modulate and transmit the data message on the out-of-band communication channel as a recoverable sequence of acoustic pulses emitted by the cooling device.

In Example 241, the subject matter of Example 240 can optionally include wherein the processing circuit is configured to directly control the activity level of the cooling device to activate and deactivate the cooling device in order to emit the recoverable sequence of acoustic pulses.

In Example 242, the subject matter of Example 240 can optionally include wherein the processing circuit is configured to increase and decrease a system workload of the processing circuit to increase and decrease a temperature of the processing circuit, and wherein the cooling device are configured to activate and deactivate in response to the temperature of the control means to prevent overheating of the control means.

In Example 243, the subject matter of Example 240 can optionally include wherein the cooling device is configured to increase and decrease the activity level of the cooling device to vary acoustic energy emitted by the cooling device.

In Example 244, the subject matter of any one of Examples 240 to 243 can optionally include wherein the cooling device is configured to adjust an activity level of the cooling device to modulate and transmit the data message on the out-of-band communication channel as a recoverable sequence of acoustic pulses emitted by the cooling device by modulating the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

In Example 245, the subject matter of any one of Examples 240 to 244 can optionally include wherein the cooling device is configured to adjust an activity level of the cooling device to modulate and transmit the data message on the out-of-band communication channel as a recoverable sequence of acoustic pulses emitted by the cooling device by modulating the data message with an error correction, error detection, or authentication scheme.

In Example 246, the subject matter of any one of Examples 240 to 245 can optionally include wherein the processing circuit is further configured to direct one or more additional components of the electrical system to stabilize the amount of acoustic energy emitted by the one or more additional components at a precalibrated level.

In Example 247, the subject matter of any one of Examples 240 to 246 can optionally include wherein the processing circuit is further configured to determine a binary data sequence corresponding to the data message, and wherein the cooling device is configured to adjust an activity level of the cooling device to modulate and transmit the data message on the out-of-band communication channel as a recoverable sequence of acoustic pulses emitted by the cooling device by increasing and decreasing an activity level of the cooling device according to one or more logical transitions in the binary data sequence to modulate and transmit the data message on the out-of-band communication channel.

In Example 248, the subject matter of any one of Examples 240 to 247 can optionally further include an acoustic sensor configured to detect and demodulate an additional recoverable sequence of acoustic pulses to recover an additional data message transmitted by the second electrical system on the out-of-band communication channel.

In Example 249, the subject matter of any one of Examples 240 to 248 can optionally include wherein the processing circuit is configured to identify a data message to transmit to the second electrical system via an out-of-band communication channel by identifying a predefined data message as the data message.

In Example 250, the subject matter of any one of Examples 240 to 248 can optionally include wherein the processing circuit is configured to identify a data message to transmit to the second electrical system via an out-of-band communication channel by identifying a data message that contains information of the signal degradation or failure of the in-band communication channel.

In Example 251, the subject matter of any one of Examples 240 to 250 can optionally include wherein the processing circuit is configured to identify signal degradation or failure of an in-band communication channel between the electrical system and a second electrical system by performing a system status check to determine whether communications over the in-band communication channel is deteriorated or failed.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electrical system comprising a processing circuit and one or more electrical components, the processing circuit configured to:
   identify signal degradation or failure of an in-band communication channel between the electrical system and a second electrical system;
   identify a data message from a pool of data messages to transmit to the second electrical system via an out-of-band communication channel; and
   direct the one or more electrical components to adjust an electrical workload to modulate and transmit the data message on the out-of-band communication channel as a recoverable sequence of pulses or fluctuations, wherein the data message includes an identifier indicating a type of data message from the pool of data messages.

2. The electrical system of claim 1,
   wherein the processing circuit is further configured to determine a binary data sequence corresponding to the data message, and
   wherein the processing circuit is configured to direct the one or more electrical components to adjust the electrical workload of the one or more electrical components to modulate and transmit the data message on the out-of-band communication channel as a recoverable sequence of pulses or fluctuations by:
   directing the one or more electrical components to increase and decrease the electrical workload of the one or more electrical components according to one or more logical transitions in the binary data sequence to modulate and transmit the data message on the out-of-band communication channel.

3. The electrical system of claim 1,
   wherein, to direct the one or more electrical components to adjust the electrical workload of the one or more electrical components to modulate and transmit the data message on the out-of-band communication channel a recoverable sequence of pulses or fluctuations, the processing circuit is further configured to:
   modulate the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

4. The electrical system of claim 1,
   wherein, to direct the one or more electrical components to adjust the electrical workload of the one or more electrical components to modulate and transmit the data message on the out-of-band communication channel a recoverable sequence of pulses or fluctuations, the processing circuit is further configured to:
   modulate the data message with an error correction, error detection, or authentication scheme.

5. The electrical system of claim 1,
   wherein, to identify a data message to transmit to the second electrical system via an out-of-band communication channel, the processing circuit is further configured to:
   identify a predefined data message as the data message.

6. The electrical system of claim 1,
   wherein, to identify a data message to transmit to the second electrical system via an out-of-band communication channel, the processing circuit is further configured to:
   identifying a data message that contains information of the signal degradation or failure of the in-band communication channel.

7. The electrical system of claim 1,
   wherein, to identify signal degradation or failure of an in-band communication channel between the electrical system and a second electrical system, the processing circuit is further configured to:
   perform a system status check to determine whether communications over the in-band communication channel is deteriorated or failed.

8. The electrical system of claim 1,
   wherein the recoverable sequence of pulses or fluctuations include at least one of:
   a recoverable sequence of thermal pulses;
   a recoverable sequence of fluctuations in a power supply of the processing circuit and the second electrical system;
   a recoverable sequence of electromagnetic noise pulses; or
   a recoverable sequence of acoustic pulses emitted by a cooling device, wherein the one or more electrical components include the cooling device.

9. The electrical system of claim 1,
   wherein, to direct the one or more electrical components to adjust an electrical workload to modulate and transmit the data message on the out-of-band communication channel as a recoverable sequence of pulses or fluctuations, the processing circuit is further configured to:
   increase and decrease the electrical workload of the one or more electrical components to vary thermal energy emitted by the one or more electrical components;
   adjust an activity level of a cooling device to vary acoustic energy emitted by the cooling device, wherein the one or more electrical components include the cooling device;

increase and decrease an electrical workload of the one or more electrical components to vary a level of electrical power drawn from a power supply of the electrical system; or increase and decrease a clock frequency of the processing circuit to vary electromagnetic noise emitted by the processing circuit.

10. An apparatus, comprising:

a memory; and a first processing circuit in communication with a memory, wherein the first processing circuit is configured to:

identify signal degradation or failure of an in-band communication channel between the first processing circuit and a second processing circuit;

identify a data message from a pool of data messages to transmit to the second processing circuit via an out-of-band communication channel; and control an electrical workload of the first processing circuit to modulate and transmit the data message on the out-of-band communication channel as a recoverable sequence of pulses or fluctuation, wherein the data message includes an identifier indicating a type of data message from the pool of data messages.

11. The apparatus of claim 10, wherein the recoverable sequence of pulses or fluctuations include at least one of:

a recoverable sequence of thermal pulses;

a recoverable sequence of fluctuations in a power supply of the first processing circuit and the second processing circuit;

a recoverable sequence of electromagnetic noise pulses; or a recoverable sequence of acoustic pulses emitted by a cooling device in communication with the apparatus.

12. The apparatus of claim 10, wherein, to control an electrical workload of the first processing circuit to modulate and transmit the data message on the out-of-band communication channel as a recoverable sequence of pulses or fluctuations, the first processing circuit is further configured to:

increase and decrease the electrical workload of the first processing circuit to vary thermal energy emitted by the first processing circuit;

adjust an activity level of a cooling device to vary acoustic energy emitted by the cooling device, wherein the first processing circuit includes the cooling device;

increase and decrease an electrical workload of the first processing circuit to vary a level of electrical power drawn from a power supply of the first processing circuit; or increase and decrease a clock frequency of the first processing circuit to vary electromagnetic noise emitted by the first processing circuit.

13. The apparatus of claim 10, wherein, to control an electrical workload of the first processing circuit to modulate and transmit the data message on the out-of-band communication channel as a recoverable sequence of pulses or fluctuations, the first processing circuit is further configured to:

modulate the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

14. The apparatus of claim 10, wherein, to control an electrical workload of the first processing circuit to modulate and transmit the data message on the out-of-band communication channel as a recoverable sequence of pulses or fluctuations, the first processing circuit is further configured to:

modulate the data message with an error correction, error detection, or authentication scheme.

15. The apparatus of claim 10, wherein, to identify a data message to transmit to the second processing circuit via an out-of-band communication channel, the first processing circuit is further configured to:

identify a predefined data message as the data message.

16. The apparatus of claim 10, wherein, to identify a data message to transmit to the second processing circuit via an out-of-band communication channel, the first processing circuit is further configured to:

identify a data message that contains information of the signal degradation or failure of the in-band communication channel.

17. The apparatus of claim 10, wherein, to identify signal degradation or failure of an in-band communication channel between the first processing circuit and a second processing circuit, the first processing circuit is further configured to:

perform a system status check to determine whether communications over the in-band communication channel is deteriorated or failed.

18. A non-transitory computer readable memory medium storing program instructions executable by a first processing circuit to:

identify signal degradation or failure of an in-band communication channel between the first processing circuit and a second processing circuit;

identify a data message from a pool of data messages to transmit to the second processing circuit via an out-of-band communication channel; and control an electrical workload of the first processing circuit to modulate and transmit the data message on the out-of-band communication channel as a recoverable sequence of pulses or fluctuations, wherein the data message includes an identifier indicating a type of data message from the pool of data messages.

19. The non-transitory computer readable memory medium of claim 18, wherein the recoverable sequence of pulses or fluctuations include at least one of:

a recoverable sequence of thermal pulses;

a recoverable sequence of fluctuations in a power supply of the first processing circuit and the second processing circuit;

a recoverable sequence of electromagnetic noise pulses; or a recoverable sequence of acoustic pulses emitted by a cooling device in communication with the first processing circuit.

20. The non-transitory computer readable memory medium of claim 18, wherein, to control an electrical workload of the first processing circuit to modulate and transmit the data message on the out-of-band communication channel as a recoverable sequence of pulses or fluctuations, the program instructions are further executable by the first processing circuit to:

modulate the data message with at least one of amplitude modulation (AM), frequency modulation (FM), phase modulation (PM), phase shift keying (PSK), amplitude shift keying (ASK), quadrature amplitude modulation (QAM), orthogonal frequency division multiplexing (OFDM), or frequency shift keying (FSK).

21. A method for transmitting a data message on an out-of-band communication channel, the method comprising:

a first electrical system,
   identifying signal degradation or failure of an in-band communication channel between the first electrical system and a second electrical system;
   identifying a data message to transmit to the second electrical system via an out-of-band communication channel; and
   directing one or more electrical components of the first electrical system to adjust an electrical workload to modulate and transmit the data message on the out-of-band communication channel as a recoverable sequence of pulses or fluctuations.

* * * * *